US012566200B2

(12) United States Patent
Pradhan et al.

(10) Patent No.: US 12,566,200 B2
(45) Date of Patent: Mar. 3, 2026

(54) DEVICE, SYSTEM, AND METHOD FOR PERFORMING AN ONLINE-UPDATE OF A TWO-PORT EQUIVALENT

(71) Applicant: Hitachi Energy Ltd, Zürich (CH)

(72) Inventors: Vedanta Pradhan, Bhubaneswar (IN); Od Naidu, Bangalore (IN)

(73) Assignee: HITACHI ENERGY LTD, Zürich (CH)

( * ) Notice: Subject to any disclaimer, the term of this patent is extended or adjusted under 35 U.S.C. 154(b) by 825 days.

(21) Appl. No.: 17/579,320

(22) Filed: Jan. 19, 2022

(65) Prior Publication Data

US 2022/0229099 A1     Jul. 21, 2022

(30) Foreign Application Priority Data

Jan. 19, 2021     (IN) .............................. 202141002387

(51) Int. Cl.
| | | |
|---|---|---|
| *G01R 27/16* | (2006.01) | |
| *H02H 1/00* | (2006.01) | |
| *H02H 7/22* | (2006.01) | |

(52) U.S. Cl.
CPC ........... *G01R 27/16* (2013.01); *H02H 1/0007* (2013.01); *H02H 7/22* (2013.01)

(58) Field of Classification Search
CPC ......... G01R 27/16; H02H 1/0007; H02H 7/22
See application file for complete search history.

(56) References Cited

U.S. PATENT DOCUMENTS

| | | | | |
|---|---|---|---|---|
| 3,883,724 A | * | 5/1975 | Pradhan .................... | G06J 1/00 700/32 |
| 7,200,500 B2 | * | 4/2007 | Larsson .................... | H02J 3/00 702/57 |
| 7,554,334 B2 | * | 6/2009 | Shannon ................ | H03H 11/28 333/32 |
| 8,050,878 B2 | * | 11/2011 | Dougherty ............. | H02H 3/006 361/60 |
| 9,130,984 B2 | * | 9/2015 | Foley .................. | H04L 63/1425 |
| 10,739,414 B2 | * | 8/2020 | Gubba Ravikumar ..................... G01R 31/54 |
| 2004/0083087 A1 | | 4/2004 | Rehtanz | |
| 2007/0055889 A1 | | 3/2007 | Henneberry et al. | |

(Continued)

FOREIGN PATENT DOCUMENTS

| | | |
|---|---|---|
| JP | 2020145913 A | 9/2020 |
| JP | 2020174521 A | 10/2020 |

(Continued)

OTHER PUBLICATIONS

EE457 of Iowa State University, 2017.*

(Continued)

*Primary Examiner* — Lina Cordero
*Assistant Examiner* — Lynda Dinh
(74) *Attorney, Agent, or Firm* — PROCOPIO, CORY, HARGREAVES & SAVITCH LLP

(57) ABSTRACT

A device or system for use with an electric power system is provided. The electric power system has a first bus, a second bus, a third bus, a first line between the first and second buses, and a second line between the third bus and one of the first and second buses. The device or system is operative to determine, responsive to at least one trip event, one or several updated impedances of an equivalent model across a line.

16 Claims, 9 Drawing Sheets

(56) References Cited

U.S. PATENT DOCUMENTS

| | | | |
|---|---|---|---|
| 2010/0121594 A1 | 5/2010 | Dougherty | |
| 2015/0051856 A1* | 2/2015 | Chu | G01R 19/2513 |
| | | | 702/65 |
| 2016/0084893 A1 | 3/2016 | Ravikumar et al. | |
| 2017/0163029 A1 | 6/2017 | Hong et al. | |
| 2019/0199090 A1 | 6/2019 | Ha et al. | |
| 2020/0064391 A1* | 2/2020 | Dase | G01R 31/085 |

FOREIGN PATENT DOCUMENTS

| | | | |
|---|---|---|---|
| TW | M379069 U | * | 4/2010 |
| WO | 2019/186490 A1 | | 10/2019 |

OTHER PUBLICATIONS

Ask Google.*

IEEE Power and Energy Society, "IEEE Guide for Protective Relay Applications to Transmission Lines", IEEE Std C37.113-2015 (Revision of IEEE Std C37.113-1999), downloaded Feb. 27, 2020, IEEE Standards Association, Sponsored by the Power System Relaying Committee, ISBN 978-1-5044-0654-3 STD20774, New York, US, 141 pages.

Mcdonald, et al., "Power Swing And Out-of-step Considerations on Transmission Lines",—A report to the Power System Relaying Committee of the IEEE Power Engineering Society, IEE PSRC WG D6, Jul. 19, 2005, 59 pages.

Eriksson et al., "An Accurate Fault Locator With Compensation for Apparent Reactance in the Fault Resistance Resulting From Remote-End Infeed", IEEE Transactions on Power Apparatus and Systems, IEEE Power Engineering Society, Power System Relaying Committee, vol. PAS-104, No. 2, Feb. 1985, p. 424-436, 14 pages, Downloaded on Apr. 23, 2020.

Thompson et al., "A Tutorial on Calculating Source Impedance Ratios for Determining Line Length", 68th Annual Conference for Protective Relay Engineers, College Station, TX, USA, Mar. 30-Apr. 2, 2015, 11 pages.

Mooney et al., "Application Guidelines for Ground Fault Protection", 1998 International Conference Modern Trends In the Protection Schemes of Electric Power Apparatus and Systems, New Delhi, India, Oct. 28-30, 1998, Printed In US, 47 pages.

* cited by examiner

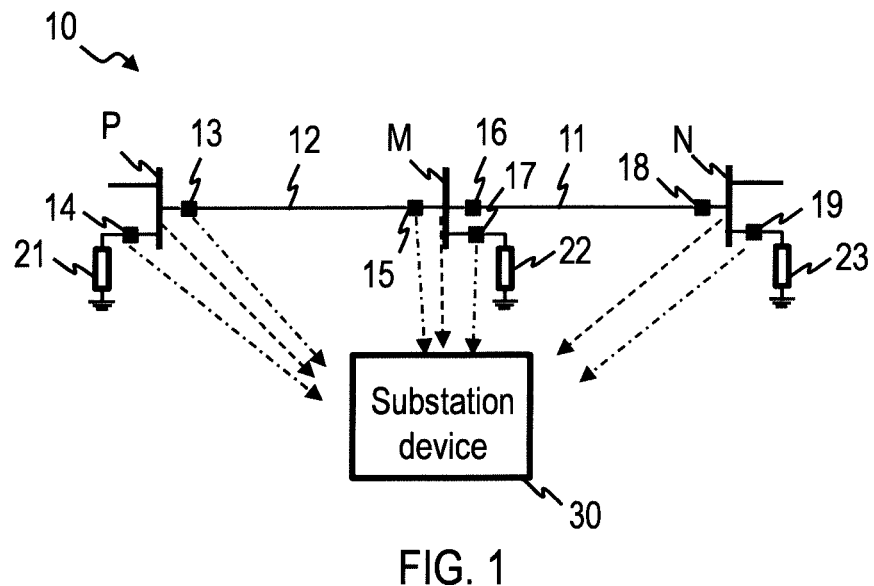
FIG. 1
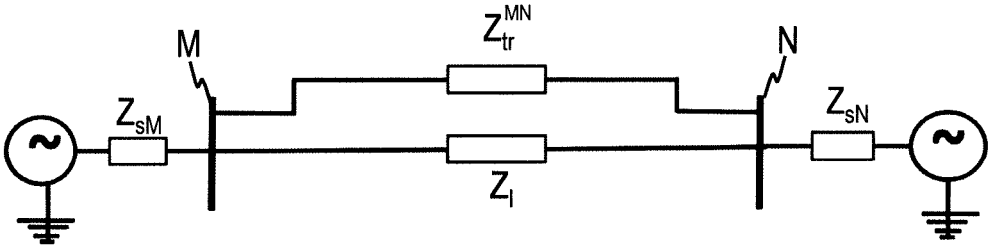
FIG. 2
FIG. 3

Determining $Z_{mm}$, $Z_{nn}$, $Z_{mn}$ from impedances
of equivalent model across line MN before trip Determining $Z_{pp}$, $Z_{mp}$, $Z_{pn}$ using
measurements (including voltage change at buses M,
N, P)

Determining update values
for $\{Z_{sM}, Z_{sN}, Z_{tr}^{MN}\}$

DEVICE, SYSTEM, AND METHOD FOR PERFORMING AN ONLINE-UPDATE OF A TWO-PORT EQUIVALENT

CROSS-REFERENCE TO RELATED APPLICATIONS

The present application claims priority to Indian Patent App. No. 202141002387, filed on Jan. 19, 2021, which is hereby incorporated herein by reference as if set forth in full.

FIELD OF THE INVENTION

The present disclosure relates to power transmission systems and devices and methods for protecting power transmission systems. The disclosure relates in particular to methods and devices that are operative to update one or several equivalent impedances of a two-port equivalent across a transmission line that can be used for various protection, control, or coordination functions.

BACKGROUND OF THE INVENTION

Various analyses in power transmission line protection use an equivalent model of the system as seen from the line terminals. Typically, in interconnected high voltage transmission systems, each such line is connected to the rest of the network through other transmission lines. Depending on the operational requirement, shunt elements such as a reactor or capacitor may also be connected at buses.

An equivalent model of the system is shown in FIG. 2, in which all components of the system (except the line of concern) are captured in a two-port Thevenin equivalent. The equivalent system has two sources with corresponding impedances $Z_{sM}$ and $Z_{sN}$. Additionally, a transfer path with impedance $Z_{tr}^{MN}$ may be present which represents equivalent of the electric power system for current flow between buses M and N except for a direct path through the branch MN itself.

The two-port Thevenin equivalent can be calculated if the full network topology and/or the network impedance matrix, i.e., $Z_{BUS}$ are available as an input. A short circuit analysis based on the complete network information can yield the two-port equivalent parameters of any particular line of interest. While such a technique could be employed when the system topology changes, the required information for re-calculating the two-port Thevenin equivalent is often not available at, e.g., a substation level.

In response to dynamic changes in topology, it may be desirable that the equivalent model be updated at a substation level (in a decentralized manner) using only the process bus information without depending on repetitive updates from the central control center of the grid. However, information of the entire network topology and topology updates from all over the system may not be available at a substation level. Therefore, a complete network analysis (CNA) may not be a viable option for execution at a substation device.

Techniques which use information of short circuit current levels at line terminals and contributions to fault currents from the line to approximately compute the equivalent model may lend themselves to implementation at the substation level. "POWER SWING AND OUT-OF-STEP CONSIDERATIONS ON TRANSMISSION LINES", IEEE PSRC WG D6, 2005, pp. 45-48, provides an exemplary technique. However, it may be difficult to obtain the required data at both the buses concurrently unless one repeatedly conducts or stages short circuit experiments at each bus every time a topology change occurs.

Other substation level approaches can consider placing bolted short circuits on a terminal of the line (see, e.g., J. Mooney and J. Peer, "Application Guidelines for Ground Fault Protection," proceedings of the 24th Annual Western Protective Relay Conference, Spokane, WA, October 1997). A source impedance can be estimated by calculating a ratio of bus voltage drop from nominal value to the change in current seen by the source. Such techniques typically address the limited problem of obtaining source impedance as seen by a protective relay placed at a terminal of the line. Moreover, they also face the challenge that a fault must be created in the system during normal operation.

U.S. Pat. No. 8,050,878 B2 discloses a device and method for dynamically determining an impedance of a network. The device includes at least a processing system for measuring a network voltage and network current when said network is determined to be in a first state, measuring a network voltage when said network is determined to be in a second state, estimating the impedance value dependent upon said measured voltages and current, adapting the estimated impedance based on at least one prior impedance value and storing at least the adapted impedance.

SUMMARY

There is a need for improved devices, systems, and methods of determining updated impedances of an equivalent model across a transmission line and/or of performing protection and/or coordination functions using such updated impedances. There is in particular a need for such devices, systems, and methods that allow updated impedances of a two-part Thevenin equivalent model of the transmission line, comprising two source impedances and a transfer path impedance to be updated. There is in particular a need for devices, systems, and methods that allow updated impedances to be determined without requiring information on the full network topology. There is in particular a need for devices, systems, and methods that allow updated impedances to be determined using measurements obtained from terminal nodes at ends of the transmission line (i.e., buses between which the transmission line extends), a further bus one level up in the network topology, and a further transmission line between the further bus and one of the terminal nodes of the transmission line.

According to embodiments, devices, systems, and methods are provided that afford an online update of the two-port equivalent. Such an online update may be performed responsive to a trip event. The online update can facilitate adaptive setting of relays which can thereby improve its dependability and security.

The devices, systems, and methods may require information from only a neighborhood of substation level measurements. Embodiments of the devices, systems, and methods can be implemented at the substation level, without requiring an update from a control center.

The devices, systems, and methods may provide an online update of the two-port equivalent that can be used in various protection applications and adds value to digital substation solutions.

The devices, systems, and methods may use information of lines and buses adjacent to the line of interest, i.e., network information of the adjacent topology, to update the two-port equivalent model across the line of interest. The effect of topology changes in the neighborhood of the line of interest can be accounted for by updating its two-port equivalent.

Embodiments of the devices, systems, and methods are operative to perform an online update of the two-port equivalent across a transmission line using substation process bus data in response to a topology change limited to one level up in network topology. The devices, systems, and methods may be operative to perform an online update of the two-port equivalent in response to at least following types of network topology changes:

A line incident upon one of the terminal buses of the line of interest trips.

A shunt element connected at an adjacent bus trips.

The devices, systems, and methods may be operative to update a network impedance submatrix without depending on the full network topology or full network impedance matrix. Rather, only information such as the initial equivalent parameters, parameters of the transmission line of interest and a tripping element (such as a second line or a shunt element at an adjacent bus) and a limited amount of voltage measurements and, optionally, current measurements are used in estimating the network impedance submatrix thus, making the techniques suitable for being performed at the substation level. The parameters used may specifically include or be the impedances of a fundamental frequency model representation of the transmission line of interest and tripping element (such as a second line or a shunt element at an adjacent bus).

Embodiments update the equivalent in response to topological changes (as described in the disclosure), by using the initial equivalent and voltage and/or current measurements related to the topology event, which is determined by breaker/switch status inputs of the switched component(s). This is a significant departure from the techniques of "POWER SWING AND OUT-OF-STEP CONSIDERATIONS ON TRANSMISSION LINES", IEEE PSRC WG D6, 2005, J. Mooney and J. Peer, "Application Guidelines for Ground Fault Protection," proceedings of the 24th Annual Western Protective Relay Conference, Spokane, WA, October 1997, and M. J. Thomson and A. Somani, "A Tutorial on Calculating Source Impedance Ratios for Determining Line Length", SEL, 2015, which need to be re-applied each time a topology event occurs by discarding the previous equivalent data.

The techniques of "POWER SWING AND OUT-OF-STEP CONSIDERATIONS ON TRANSMISSION LINES", IEEE PSRC WG D6, 2005, J. Mooney and J. Peer, "Application Guidelines for Ground Fault Protection," proceedings of the 24th Annual Western Protective Relay Conference, Spokane, WA, October 1997, and M. J. Thomson and A. Somani, "A Tutorial on Calculating Source Impedance Ratios for Determining Line Length", SEL, 2015 need staging of faults on the modified system (i.e. the system after the topology change), or one has to wait for a fault event to occur before they can be deployed to re-estimate the equivalent. This can lead to delay in obtaining the new equivalent parameters and the functionalities which depend on them have to continue using the old data.

In an embodiment, a device or system for use with an electric power system is provided. The electric power system has a first bus, a second bus, a third bus, a first line between the first and second buses, and a second line between the third bus and one of the first and second buses. The device or system comprises an interface to receive measurements comprising voltage measurements for one or several of the buses and to receive switch status information.

The device or system is operative to determine, responsive to at least one trip event, one or several updated impedances of an equivalent model from the received measurements and impedances of the equivalent model obtained before the at least one trip event.

The device or system may be operative to use model parameters of the first line and at least one of the second line or a shunt element which trips for determining the updated impedances.

The interface may be operative to receive current measurements.

The interface may be operative to receive current measurements for at least one of the first and second lines or for at least one shunt element.

The device or system may be operative to perform an online update of the equivalent model during field operation, by determining the one or several updated impedances.

The device or system may be operative such that all measurements and, optionally, the switch status information used for determining the one or several updated impedances of the equivalent model may be obtained in a neighborhood of the first line.

The neighborhood of the first line from which measurements are used for determining the updated impedances may include the first and second lines, the first, second, and third buses, and shunt elements connected thereto, including associated switches and/or circuit breakers.

The device or system may be operative such that all measurements and, optionally, the switch status information used for determining the one or several updated impedances of the equivalent model are obtained from a neighborhood of the first line that includes the first and second lines, the first, second, and third buses, and shunt elements connected thereto, including associated switches and/or circuit breakers.

The device or system may be operative to determine the updated impedances of the equivalent model without requiring measurements other than measurements obtained from a neighborhood of the first line that includes the first and second lines, the first, second, and third buses, and shunt elements connected thereto, including associated switches and/or circuit breakers.

The device or system may be operative to receive the measurements (such as voltage and/or current measurements) and/or switch status information via a substation automation communication network.

The device or system may be operative to receive the measurements and/or switch status information in messages in accordance with a substation automation communication protocol.

The device or system may be operative to receive the measurements and/or switch status information in messages in accordance with a substation automation communication protocol.

The device or system may be operative to receive the measurements and/or switch status information in messages in accordance with or compatible with International Electrotechnical Commission (IEC) 61850.

The device or system may be operative to receive the measurements and/or switch status information in messages in accordance with or compatible with IEC 61850:8-1, IEC 61850:8-2, and/or IEC 61850:9.

The device or system may be operative to receive the measurements and/or switch status information in messages in accordance with or compatible with IEC 61850:8-1 (2011), IEC 61850:8-2 (2018), and/or IEC 61850:9 (2011) and/or IEC 61850:9/AMD1:2020 (2020).

The device or system may be operative such that all measurements and, optionally, the switch status information used for determining the one or several updated impedances of the equivalent model may be substation process bus level measurements.

The switch status information may be or may comprise measurements of switch state (such as tripped or untripped).

The switch status information may be or may comprise messages transmitted by at least one intelligent electronic device (IED) and indicative a current or imminent switch state (such as tripped or untripped). The switch status information may be obtained by analyzing messages transmitted by at least one IED. The messages may be GOOSE messages or other messages in accordance with IEC 61850.

The switch status information may include information indicative of a trip of a switch on the line incident upon one of the terminal buses of the line of interest.

The switch status information may include information indicative of a trip of a shunt element connected at a bus adjacent the terminal buses of the line of interest.

The at least one trip event may be detected based on the switch status information and, more particularly, based on a change in switch status (e.g., from untripped to tripped).

The one or several updated impedances of the equivalent model may be updated impedances of a two-port equivalent across the first line subsequent to the at least one trip event.

The impedances of the equivalent model obtained before the at least one trip event may comprise base impedances of the equivalent model of the two-port equivalent prior to the at least one trip event.

The device or system may be operative to perform at least one protection function using the updated impedances of the equivalent model.

The device or system may be operative to use the updated impedances of the equivalent model for at least one of:
- distance relaying;
- adaptive relaying;
- fault location determination (such as single-ended fault location determination, without being limited thereto);
- system non-homogeneity factor determination;
- distance relay reach determination;
- adaptive selection of phase selection methods for system protection, optionally wherein the phase selection methods comprise phasor, superimposed quantities, or travelling-wave based methods;
- short circuit ratio, SCR, determination;
- overcurrent relay coordination.

The updated impedances of the equivalent model may comprise an updated first equivalent source impedance, an updated second equivalent source impedance, and an updated equivalent transfer path impedance.

The device or system may be operative to determine at least one matrix element of an impedance submatrix using the measurements, perform series and/or shunt branch modifications of the impedance submatrix to determine matrix elements of a modified impedance submatrix, and determine the updated impedances of the equivalent model of the two-port equivalent using the modified impedance submatrix.

The device or system may be operative to determine at least one matrix element of a bus impedance submatrix using the measurements, perform series and/or shunt branch modifications of the bus impedance submatrix to determine matrix elements of a modified bus impedance submatrix, and determine the updated impedances of the equivalent model of the two-port equivalent using the modified bus impedance submatrix.

The bus impedance submatrix may be $$Z(mnp) = \begin{pmatrix} Z_{mm} & Z_{mn} & Z_{mp} \\ Z_{nm} & Z_{nn} & Z_{np} \\ Z_{pm} & Z_{pn} & Z_{pp} \end{pmatrix},$$

wherein $Z_{ij}$ designates the impedance of the equivalent model between two nodes i and j selected from $\{m, n, p\}$, wherein m designates the first bus, n designates the second bus, and p designates the third bus.

The device or system may be operative to determine $Z_{np}=Z_{pn}$ using the measurements.

The device or system may be operative to determine at least $Z_{mm}$, $Z_{mn}$, $Z_{nm}$, and $Z_{nn}$ from impedances of the equivalent model of the two-port equivalent obtained before the at least one trip event and modification calculations.

The device or system may be operative to determine the one or several updated impedances of the equivalent model responsive to a trip of the second line.

The device or system may be operative to determine the one or several updated impedances of the equivalent model responsive to a trip of the second line using measurements of a change in voltage at the second bus in response to the trip of the second line and a current on the second line at the first bus before the trip of the second line (which may be measured or calculated) and a charging current of the second line before the trip of the second line (which is calculated).

The device or system may be operative to determine the one or several updated impedances of the equivalent model using the following additional quantities obtained from measurements (which encompasses quantities derived computationally from measurements): (i) changes in voltages at the first and third buses in response to the trip of the second line; or (ii) a current of the second line at first bus before the trip of the second line.

The device or system may be operative to determine the one or several updated impedances of the equivalent model responsive to a trip of the second line using only measurements of a change in voltage at the second bus in response to the trip of the second line and a current on the second line at the first bus before the trip of the second line (which may be measured or calculated) and (i) changes in voltages at the first and third buses in response to the trip of the second line (which may be measured or computationally derived from measurements); or (ii) a current of the second line at first bus before the trip of the second line (which may be measured or computationally derived from measurements).

The device or system may be operative to determine, responsive to a trip of the second line, $Z_{np}=Z_{pn}$ such that it fulfils $$Z_{np} = Z_{pn} = \frac{\left(D(Z_{nm} - A + BE) + \dfrac{kEZ_{sh}^t}{Z_d - Z_{sh}^t}\right) - \dfrac{\Delta V_n}{(I_{mp} + I_{mc})}}{D(1 + B) + kZ_{sh}^t/(Z_d - Z_{sh}^t)},$$

where:

$$A = \frac{Z_{nm}(Z_{mm} - Z_{mp})}{Z_{mm} - Z_{sh}^t},$$

-continued $$F = Z_{mp} - Z_{pp} \frac{Z_{mp}(Z_{mn} - Z_{mp})}{Z_{mn} - Z_{sh}^t},$$

$$Z_d = Z_{pp} - \frac{Z_{mn}^2}{Z_{mn} - Z_{sh}^t},$$

$$x_d = Z_{mn}\left(-\frac{Z_{sh}^t}{Z_{mn} - Z_{sh}^t}\right),$$

$$\overline{X} = F\left(-\frac{Z_{sh}^t}{Z_{mn} - Z_{sh}^t}\right),$$

$$Z = (Z_{mn} - Z_{mp})\left(-\frac{Z_{sh}^t}{Z_{mn} - Z_{sh}^t}\right) - \frac{x_d F}{Z_d - Z_{sh}^t},$$

$$\delta = Z - \overline{X} - Z_l^t,$$

$$B = \frac{F}{Z_d - Z_{sh}^t},$$

$$c = -\frac{Z_l^t}{\delta},$$

$$D = C - \frac{kX}{\delta},$$

$$E = Z_{mp}Z_{mn} / (Z_{mn} - Z_{sh}^t),$$

$$k = (I_{mc} + I_{pc}) / (I_{mp} + I_{mc}),$$

where $Z_{sh}^t$ is an impedance associated with the charging current of the tripped second line, $Z_l^t$ is a series impedance of the tripped second line, $\Delta V_n$ is a change in voltage at the second bus in response to the trip of the second line, $I_{mc}$ is a charging current of the second line at the first bus before the trip of the second line (which may be calculated), $I_{pc}$ is a charging current of the second line at the second bus before the trip of the second line (which may be calculated), and $I_{mp}+I_{mc}$ is a current measured on the second line at the first bus before the trip of the second line (which may be measured or computationally derived from measurements).

The device or system may be operative to determine $I_{mc}$ and $I_{pc}$ according to:

$$I_{mc} = \frac{V_m^0}{Z_{sh}^t}, I_{pc} = \frac{V_p^0}{Z_{sh}^t}$$

The device or system may be operative to determine $I_{mp}+I_{mc}$ from a current measurement.

The device or system may be operative to determine $I_{mp}+I_{mc}$ computationally from voltage measurements according to $$I_{mp} + I_{mc} = \frac{V_m^0 - V_p^0}{Z_l^t} + \frac{V_m^0}{Z_{sh}^t}$$

where $V_m^0$ and $V_p^0$ are the voltages measured at bus M and bus P respectively before occurrence of the trip event and $Z_{sh}^t$ is an impedance associated with the charging current of the tripped second line, $Z_l^t$ is series impedance of the tripped second line.

The device or system may be operative to determine at least $Z_{mp}$, $Z_{pm}$, and $Z_{pp}$ by using impedances of the equivalent model of the two-port equivalent obtained before the at least one trip event and modification calculations.

The device or system may be operative to determine at least $Z_{mp}$, $Z_{pm}$, and $Z_{pp}$ using the measurements.

The device or system may be operative to determine, responsive to a trip of the second line, $Z_{np}=Z_{pn}$, $Z_{mp}=Z_{pm}$, and $Z_{pp}$ such that they fulfil $$(Z_{mn} - Z_{mp}) = \eta \frac{\Delta V_m}{(I_{mp} + I_{mc})\Delta V_n},$$

$$(Z_{mn} - Z_{np}) = \eta \frac{\Delta V_n}{(I_{mp} + I_{mc})},$$

$$(Z_{pm} - Z_{pp}) = \eta \frac{\Delta V_p}{(I_{mp} + I_{mc})}$$

where:

$$\frac{1}{\eta} = \left(1 + \left(1 - \frac{\Delta V_p}{\Delta V_m}\right)\frac{\Delta V_m}{(I_{mp} + I_{mc})}\right) \Big/ Z_l^t,$$

where $Z_l^t$ is a line impedance of the second line, $\Delta V_m$ is a change in voltage at the first bus in response to the trip of the second line, $\Delta V_n$ is a change in voltage at the second bus in response to the trip of the second line, $\Delta V_p$ is a change in voltage at the third bus in response to the trip of the second line, and $I_{mp}+I_{mc}$ is a current measured on the second line at the first bus before the trip of the second line (which may be measured or computationally derived from measurements).

The device or system may be operative to determine $I_{mp}+I_{mc}$ from a current measurement.

The device or system may be operative to determine $I_{mp}+I_{mc}$ computationally from voltage measurements according to $$I_{mp} + I_{mc} = \frac{V_m^0 - V_p^0}{Z_l^t} + \frac{V_m^0}{Z_{sh}^t}$$

where $V_m^0$ and $V_p^0$ are the voltages measured at bus M and bus P respectively before occurrence of the trip event and $Z_{sh}^t$ is an impedance associated with the charging current of the tripped second line, $Z_l^t$ is series impedance of the tripped second line.

The device or system may be operative to determine the one or several updated impedances of the equivalent model responsive to a trip of a shunt element at the third bus.

The device or system may be operative to determine the one or several updated impedances of the equivalent model responsive to a trip of a shunt element at the third bus using a shunt current through the shunt element at the third bus prior to the trip of the shunt element (which may be measured or computationally derived from measurements) and a change in voltage at the second bus in response to the trip of the shunt element (which may be measured or computationally derived from measurements).

The device or system may be operative to determine the one or several updated impedances of the equivalent model responsive to a trip of a shunt element at the third bus using only the following quantities included in or computationally derived from measurements: a shunt current through the shunt element at the third bus prior to the trip of the shunt element and a change in voltage at the second bus in response to the trip of the shunt element.

The device or system may be operative to determine the one or several updated impedances of the equivalent model responsive to a trip of a shunt element at the third bus further using changes in voltages at the first and third buses in response to the trip of the shunt element (which may be measured or computationally derived from measurements).

The device or system may be operative to determine the one or several updated impedances of the equivalent model responsive to a trip of a shunt element at the third bus using only the following quantities included in or computationally derived from measurements (it being noted that the other quantities used do not need to be determined from measurements in field operation): a shunt current through the shunt element at the third bus prior to the trip of the shunt element and a change in voltage at the second bus in response to the trip of the shunt element and measurements of changes in voltages at the first and third buses in response to the trip of the shunt element.

The device or system may be operative to determine, responsive to a trip of a shunt element at the third bus, $Z_{np}=Z_{pn}$ such that it fulfils $$Z_{pn} = \left( \frac{Z_{pp} - Z_{sh}}{-Z_{sh}} \right) \frac{\Delta V_n}{I_p^{sh}}$$

where $Z_{sh}$ is an impedance of the shunt element at the third bus prior to the trip of the shunt element, $I_p^{sh}$ is a shunt current through the shunt elements prior to the trip of the shunt element, $\Delta V_n$ is a change in voltage at the second bus in response to the trip of the shunt element.

The device or system may be operative to obtain $I_p^{sh}$ from a shunt current measurement prior to the trip of the shunt element.

The device or system may be operative to obtain $I_p^{sh}$ computationally according to $$I_p^{sh} = \frac{V_p^0}{Z_{sh}}.$$

The device or system may be operative to determine at least $Z_{mp}$, $Z_{pm}$, and $Z_{pp}$ by using impedances of the equivalent model of the two-port equivalent obtained before the at least one trip event and modification calculations.

The device or system may be operative to determine at least $Z_{mp}$, $Z_{pm}$, and $Z_{pp}$ using the measurements.

The device or system may be operative to determine, responsive to a trip of a shunt element at the third bus, $Z_{np}=Z_{pn}$, $Z_{mp}$, $Z_{pm}$, and $Z_{pp}$ such that they fulfil $$Z_{pp} = \frac{Z_{sh} \times \frac{\Delta V_p}{I_p^{sh}}}{Z_{sh} + \frac{\Delta V_p}{I_p^{sh}}},$$

$$Z_{pn} = \left( \frac{Z_{pp} - Z_{sh}}{-Z_{sh}} \right) \frac{\Delta V_n}{I_p^{sh}},$$

$$Z_{mp} = \left( \frac{Z_{pp} - Z_{sh}}{-Z_{sh}} \right) \frac{\Delta V_m}{I_p^{sh}},$$

where $Z_{sh}$ is an impedance of the shunt element at the third bus prior to the trip of the shunt element, $I_p^{sh}$ is a shunt current through the shunt element at the third bus prior to the trip of the shunt element, $\Delta V_n$ is a change in voltage at the second bus in response to the trip of the shunt element, $\Delta V_m$ is a change in voltage at the first bus in response to the trip of the shunt element, and $\Delta V_p$ is a change in voltage at the third bus in response to the trip of the shunt element.

The device or system may be operative to obtain $I_p^{sh}$ from a shunt current measurement prior to the trip of the shunt element.

The device or system may be operative to obtain $I_p^{sh}$ computationally according to $$I_p^{sh} = \frac{V_p^0}{Z_{sh}}.$$

The device or system may be operative to determine the modified bus impedance submatrix $$Z(mnp)'' = \begin{pmatrix} Z_{mm}'' & Z_{mn}'' & Z_{mp}'' \\ Z_{nm}'' & Z_{nn}'' & Z_{np}'' \\ Z_{pm}'' & Z_{pn}'' & Z_{pp}'' \end{pmatrix}$$

from the bus impedance submatrix Z(mnp) by performing series branch modifications comprising removing the branches between nodes m and p and between nodes m and n.

The device or system may be operative to determine the updated impedances of the equivalent model of the two-port equivalent such that they fulfil $$Z_{sM} = \frac{Z_{mm}'' Z_{nn}'' - Z_{mn}'' Z_{nm}''}{Z_{nn}'' - Z_{mn}''},$$

$$Z_{sN} = \frac{Z_{mm}'' Z_{nn}'' - Z_{mn}'' Z_{nm}''}{Z_{mm}'' - Z_{mn}''},$$

$$Z_{tr}^{MN} = \frac{Z_{mm}'' Z_{nn}'' - Z_{mn}'' Z_{nm}''}{Z_{mn}''}.$$

The device or system may be operative to determine the one or several updated impedances of the equivalent model responsive to at least one of:

a trip of the second line;

a trip of a shunt element at the third bus.

The device or system may comprise at least one integrated circuit coupled to the interface and operative to determine the at least one updated impedance of the equivalent model.

The interface may be operative for communicative coupling to a substation bus.

The device or system may comprise a storage device to store the impedances of the equivalent model and/or bus impedance submatrix elements obtained before the at least one trip event.

The device or system may be operative for communicative coupling to a storage device to retrieve the impedances of the equivalent model and/or bus impedance submatrix elements obtained before the at least one trip event from the storage device.

The device or system may be a substation device or substation system, such as a substation computer.

An electric power system according to an embodiment comprises a first bus, a second bus, a third bus, a first line between the first and second buses, a second line between the third bus and one of the first and second buses, and the device or system according to any embodiment to determine updated impedances of the equivalent model of a two-port equivalent from the received measurements and impedances of the equivalent model obtained before the at least one trip event.

The device or system may be operative to use model parameters of the first line and at least one of the second line or a shunt element which trips for determining the updated impedances.

The device or system may be a protection or coordination system operative to perform at least one protection or coordination function using the updated impedances of the equivalent model.

The electric power system may comprise a protection or coordination system communicatively coupled to the device or system, the protection or coordination system being operative to perform at least one protection or coordination function using the updated impedances of the equivalent model.

The device or system may be operative to determine the one or several updated impedances of the equivalent model of the two-port equivalent across the first line responsive to a trip of the second line.

The electric power system may comprise a shunt element at the third bus.

The device or system may be operative to determine the one or several updated impedances of the equivalent model of the two-port equivalent across the first line responsive to a trip of the shunt element.

The device or system that is operative to determine the updated impedances of the equivalent model may be a substation device or a substation system.

An electric power system according to an embodiment may comprise a plurality of substations, each comprising a substation device or system operative to determine updated impedances of a two-port equivalent model.

The device or system operative to determine updated impedances may respectively be a device or system according to an embodiment.

The electric power system may comprise a central entity communicatively coupled to the substation devices or systems and operative to coordinate the substation devices or systems and/or to combine updated impedances obtained from different substation devices or system.

The substation devices or systems may be operative to update equivalent impedances independently of each other.

A first substation device or system may be operative to update impedances using measurements of the substation and, optionally, an adjacent bus and incident line responsive to a first trip event. A time at which the first substation device or system determines the updated impedances may be independent of a time at which any of the other substation devices or system (e.g., a second substation device or system of a second substation and/or a third substation device or system of a third substation) determines updated impedances.

A second substation device or system may be operative to update impedances using measurements of the substation and, optionally, an adjacent bus and incident line responsive to a second trip event. A time at which the second substation device or system determines the updated impedances may be independent of a time at which any of the other substation devices or system (e.g., the first substation device or system of the second substation and/or a third substation device or system of a third substation) determines updated impedances.

The impedances of the first, second and, if present, additional substation devices or systems as updated during field operation may be updated at times and/or to values that are independent of each other.

The central entity may be operative to receive updated impedances from the substation devices or systems.

The central entity may be operative to combine updated impedances from the substation devices or systems.

The central entity may be operative to update a bus matrix, using the updated impedances from the substation devices or systems.

The central entity may be operative to coordinate operation of the substation devices or systems of different substations.

The central entity may be a central controller.

The central entity and/or the substation devices or systems may be operative to use the updated impedances for analyses, protection and/or coordination functions.

The central entity and/or the substation devices or systems may be operative to use the updated impedances for one or several of: setting operational characteristics of a distance relay, setting power swing blinders and/or out of step logic, locating a fault on the line when using only single ended measurements.

Embodiments of a method of determining updated impedances of an equivalent model across a transmission line for an electric power system is provided. The electric power system may have a first bus, a second bus, a third bus, a first line between the first and second buses, and a second line between the third bus and one of the first and second buses. The method may comprise receiving, by a device or system, measurements comprising voltage measurements for one or several of the buses and switch status information. The method may comprise determining, by the device or system, responsive to at least one trip event, one or several updated impedances of the equivalent model from the received measurements and impedances of the equivalent model obtained before the at least one trip event.

In the method, an online update of the equivalent model may be performed during field operation, by determining the one or several updated impedances.

The method may use model parameters of the first line and at least one of the second line or a shunt element which trips for determining the updated impedances.

The measurements may comprise current measurements.

The current measurements may comprise current measurements for at least one of the first and second lines or for at least one shunt element.

All measurements and, optionally, the switch status information used for determining the one or several updated impedances of the equivalent model may be obtained in a neighborhood of the first line.

All measurements and, optionally, the switch status information used for determining the one or several updated impedances of the equivalent model may be substation process bus level measurements.

The neighborhood of the first line from which measurements are used for determining the updated impedances may include the first and second lines, the first, second, and third buses, and shunt elements connected thereto, including associated switches and/or circuit breakers.

All measurements and, optionally, the switch status information used for determining the one or several updated impedances of the equivalent model may be obtained from a neighborhood of the first line that includes the first and second lines, the first, second, and third buses, and shunt elements connected thereto, including associated switches and/or circuit breakers.

The updated impedances of the equivalent model may be determined without requiring measurements other than measurements obtained from a neighborhood of the first line that includes the first and second lines, the first, second, and third buses, and shunt elements connected thereto, including associated switches and/or circuit breakers.

The measurements (such as voltage and/or current measurements) and/or switch status information may be received via a substation automation communication network.

The measurements and/or switch status information may be received in messages in accordance with a substation automation communication protocol.

The measurements and/or switch status information may be received in messages in accordance with a substation automation communication protocol.

The measurements and/or switch status information may be received in messages in accordance with or compatible with IEC 61850.

The measurements and/or switch status information may be received in messages in accordance with or compatible with IEC 61850:8-1, IEC 61850:8-2, and/or IEC 61850:9.

The measurements and/or switch status information may be received in messages in accordance with or compatible with IEC 61850:8-1 (2011), IEC 61850:8-2 (2018), and/or IEC 61850:9 (2011) and/or IEC 61850:9/AMD1:2020 (2020).

The switch status information may be or may comprise measurements of switch state (such as tripped or untripped).

The switch status information may be or may comprise messages transmitted by at least one intelligent electronic device (IED) and indicative a current or imminent switch state (such as tripped or untripped). The switch status information may be obtained by analyzing messages transmitted by at least one IED. The messages may be GOOSE messages or other messages in accordance with IEC 61850.

The switch status information may include information indicative of a trip of a switch on the line incident upon one of the terminal buses of the line of interest.

The switch status information may include information indicative of a trip of a shunt element connected at a bus adjacent the terminal buses of the line of interest.

The at least one trip event may be detected based on the switch status information and, more particularly, based on a change in switch status (e.g., from untripped to tripped).

The one or several updated impedances of the equivalent model may be updated impedances of a two-port equivalent across the first line subsequent to the at least one trip event.

The impedances of the equivalent model obtained before the at least one trip event may comprise impedances of the equivalent model of the two-port equivalent prior to the at least one trip event.

The updated impedances of the equivalent model may comprise an updated first equivalent source impedance, an updated second equivalent source impedance, and an updated equivalent transfer path impedance.

The method may comprise determining at least one matrix element of an impedance submatrix using the measurements, performing series and/or shunt branch modifications of the impedance submatrix to determine matrix elements of a modified impedance submatrix, and determining the updated impedances of the equivalent model of the two-port equivalent using the modified impedance submatrix.

The method may comprise determining at least one matrix element of a bus impedance submatrix using the measurements, performing series and/or shunt branch modifications of the bus impedance submatrix to determine matrix elements of a modified bus impedance submatrix, and determining the updated impedances of the equivalent model of the two-port equivalent using the modified bus impedance submatrix.

The bus impedance submatrix may be $$Z(mnp) = \begin{pmatrix} Z_{mm} & Z_{mn} & Z_{mp} \\ Z_{nm} & Z_{nn} & Z_{np} \\ Z_{pm} & Z_{pn} & Z_{pp} \end{pmatrix},$$

wherein $Z_{ij}$ designates the impedance of the equivalent model between two nodes i and j selected from $\{m, n, p\}$, wherein m designates the first bus, n designates the second bus, and p designates the third bus.

The impedance submatrix elements $Z_{np} = Z_{pn}$ may be determined using the measurements.

At least $Z_{mm}$, $Z_{mn}$, $Z_{nm}$, and $Z_{nn}$ may be determined from impedances of the equivalent model of the two-port equivalent obtained before the at least one trip event and modification calculations.

The method may comprise determining the one or several updated impedances of the equivalent model responsive to a trip of the second line.

The device or system may determine the one or several updated impedances of the equivalent model responsive to a trip of the second line using measurements of a change in voltage at the second bus in response to the trip of the second line and a current on the second line at the first bus before the trip of the second line (which may be measured or calculated) and a charging current of the second line before the trip of the second line (which is calculated).

The method may comprise determining using the following additional quantities obtained from measurements (which encompasses quantities derived computationally from measurements): (i) changes in voltages at the first and third buses in response to the trip of the second line; or (ii) a current of the second line at first bus before the trip of the second line.

The method may comprise determining the one or several updated impedances of the equivalent model responsive to a trip of the second line using only measurements of a change in voltage at the second bus in response to the trip of the second line and a current on the second line at the first bus before the trip of the second line (which may be measured or calculated) and (i) changes in voltages at the first and third buses in response to the trip of the second line (which may be measured or computationally derived from measurements); or (ii) a current of the second line at first bus before the trip of the second line (which may be measured or computationally derived from measurements).

The method may comprise determining, responsive to a trip of the second line, $Z_{np} = Z_{pn}$ such that it fulfils $$Z_{np} = Z_{pn} = \frac{\left( D(Z_{nm} - A + BE) + \frac{kEZ_{sh}^t}{Z_d - Z_{sh}^t} \right) - \frac{\Delta V_n}{(I_{mp} + I_{mc})}}{D(1 + B) + kZ_{sh}^t / (Z_d - Z_{sh}^t)},$$

where:

$$A = \frac{Z_{nm}(Z_{mm} - Z_{mp})}{Z_{mm} - Z_{sh}^t},$$

$$F = Z_{mp} - Z_{pp} - \frac{Z_{mp}(Z_{mm} - Z_{mp})}{Z_{mm} - Z_{sh}^t},$$

$$Z_d = Z_{pp} - \frac{Z_{mm}^2}{Z_{mm} - Z_{sh}^t},$$

$$x_d = Z_{mm}\left(-\frac{Z_{sh}^t}{Z_{mm} - Z_{sh}^t}\right),$$

$$\overline{X} = F\left(-\frac{Z_{sh}^t}{Z_{mm} - Z_{sh}^t}\right),$$

$$\overline{Z} = (Z_{mm} - Z_{mp})\left(-\frac{Z_{sh}^t}{Z_{mm} - Z_{sh}^t}\right) - \frac{x_d F}{Z_d - Z_{sh}^t},$$

$$\delta = \overline{Z} - \overline{X} - Z_l^t,$$

$$B = \frac{F}{Z_d - Z_{sh}^t},$$

$$C = -\frac{Z_l^t}{\delta},$$

$$D = C - \frac{k\overline{X}}{\delta},$$

$$E = Z_{mp}Z_{mn}/(Z_{mm} - Z_{sh}^t),$$

$$k = (I_{mc} + I_{pc})/(I_{mp} + I_{mc}),$$

where $Z_{sh}^t$ is an impedance associated with the charging current of the tripped second line,
$Z_l^t$ is a series impedance of the tripped second line,
$\Delta V_n$ is a change in voltage at the second bus in response to the trip of the second line,
$I_{mc}$ is a charging current of the second line at the first bus before the trip of the second line (which may be calculated), $I_{pc}$ is a charging current of the second line at the second bus before the trip of the second line (which may be calculated) and $I_{mp} + I_{mc}$ is a current measured on the second line at the first bus before the trip of the second line (which may be measured or computationally derived from measurements).

The method may comprise determining $I_{mc}$ and $I_{pc}$ according to:

$$I_{mc} = \frac{V_m^0}{Z_{sh}^t}, I_{pc} = \frac{V_p^0}{Z_{sh}^t}$$

The method may comprise determining $I_{mp} + I_{mc}$ from a current measurement.

The method may comprise determining $I_{mp} + I_{mc}$ computationally from voltage measurements according to $$I_{mp} + I_{mc} = \frac{V_m^0 - V_p^0}{Z_l^t} + \frac{V_m^0}{Z_{sh}^t}$$

where $V_m^0$ and $V_p^0$ are the voltages measured at bus M and bus P respectively before occurrence of the trip event and $Z_{sh}^t$ is an impedance associated with the charging current of the tripped second line, $Z_l^t$ is series impedance of the tripped second line.

The method may comprise determining at least $Z_{mp}$, $Z_{pm}$, and $Z_{pp}$ by using impedances of the equivalent model of the two-port equivalent obtained before the at least one trip event and modification calculations.

The method may comprise determining at least $Z_{mp}$, $Z_{pm}$, and $Z_{pp}$ using the measurements.

The method may comprise determining, responsive to a trip of the second line, $Z_{np} = Z_{pn}$, $Z_{mp} = Z_{pm}$, and $Z_{pp}$ such that they fulfil $$(Z_{mm} - Z_{mp}) = \eta \frac{\Delta V_m}{(I_{mp} + I_{mc})},$$

$$(Z_{nm} - Z_{np}) = \eta \frac{\Delta V_n}{(I_{mp} + I_{mc})},$$

$$(Z_{pm} - Z_{pp}) = \eta \frac{\Delta V_p}{(I_{mp} + I_{mc})}$$

where:

$$\frac{1}{\eta} = \left(1 + \left(1 - \frac{\Delta V_p}{\Delta V_m}\right)\frac{\Delta V_m}{(I_{mp} + I_{mc})}\right)\bigg/ Z_l^t,$$

where $Z_l^t$ is a line impedance of the second line,
$\Delta V_m$ is a change in voltage at the first bus in response to the trip of the second line,
$\Delta V_n$ is a change in voltage at the second bus in response to the trip of the second line,
$\Delta V_p$ is a change in voltage at the third bus in response to the trip of the second line, and
$I_{mp} + I_{mc}$ is a current measured on the second line at the first bus before the trip of the second line (which may be measured or computationally derived from measurements).

The method may comprise determining $I_{mp} + I_{mc}$ from a current measurement.

The method may comprise determining $I_{mp} + I_{mc}$ computationally from voltage measurements according to $$I_{mp} + I_{mc} = \frac{V_m^0 - V_p^0}{Z_l^t} + \frac{V_m^0}{Z_{sh}^t}$$

where $V_m^0$ and $V_p^0$ are the voltages measured at bus M and bus P respectively before occurrence of the trip event and $Z_{sh}^t$ is an impedance associated with the charging current of the tripped second line, $Z_l^t$ is series impedance of the tripped second line.

The method may comprise determining the one or several updated impedances of the equivalent model responsive to a trip of a shunt element at the third bus.

The method may comprise determining the one or several updated impedances of the equivalent model responsive to a trip of a shunt element at the third bus using a shunt current through the shunt element at the third bus prior to the trip of the shunt element (which may be measured or computationally derived from measurements) and a change in voltage at the second bus in response to the trip of the shunt element (which may be measured or computationally derived from measurements).

The method may comprise determining the one or several updated impedances of the equivalent model responsive to a trip of a shunt element at the third bus using only the following quantities included in or computationally derived from measurements (it being noted that the other quantities used do not need to be determined from measurements in field operation): a shunt current through the shunt element at the third bus prior to the trip of the shunt element and a change in voltage at the second bus in response to the trip of the shunt element.

The method may comprise determining the one or several updated impedances of the equivalent model responsive to a trip of a shunt element at the third bus further using changes in voltages at the first and third buses in response to the trip of the shunt element (which may be measured or computationally derived from measurements).

The method may comprise determining the one or several updated impedances of the equivalent model responsive to a trip of a shunt element at the third bus using only the following quantities included in or computationally derived from measurements (it being noted that the other quantities used do not need to be determined from measurements in field operation): a shunt current through the shunt element at the third bus prior to the trip of the shunt element (which may be obtained from a current measurement or determined computationally from a voltage measurement) and a change in voltage at the second bus in response to the trip of the shunt element and measurements of changes in voltages at the first and third buses in response to the trip of the shunt element.

The method may comprise determining, responsive to a trip of a shunt element at the third bus, $Z_{np}=Z_{pn}$ such that it fulfils $$Z_{pn} = \left(\frac{Z_{pp} - Z_{sh}}{-Z_{sh}}\right)\frac{\Delta V_n}{I_p^{sh}}$$

where $Z_{sh}$ is an impedance of the shunt element at the third bus prior to the trip of the shunt element,
$I_p^{sh}$ is a shunt current through the shunt elements prior to the trip of the shunt element,
$\Delta V_n$ is a change in voltage at the second bus in response to the trip of the shunt element.

The method may comprise determining $I_p^{sh}$ from a shunt current measurement prior to the trip of the shunt element.

The method may comprise determining $I_p^{sh}$ computationally according to $$I_p^{sh} = \frac{V_p^0}{Z_{sh}}.$$

The method may comprise determining at least $Z_{mp}$, $Z_{pm}$, and $Z_{pp}$ by using impedances of the equivalent model of the two-port equivalent obtained before the at least one trip event and modification calculations.

The method may comprise determining at least $Z_{mp}$, $Z_{pm}$, and $Z_{pp}$ using the measurements.

The method may comprise determining, responsive to a trip of a shunt element at the third bus, $Z_{np}=Z_{pn}$, $Z_{mp}$, $Z_{pm}$, and $Z_{pp}$ such that they fulfil $$Z_{pp} = \frac{Z_{sh} \times \frac{\Delta V_p}{I_p^{sh}}}{Z_{sh} + \frac{\Delta V_p}{I_p^{sh}}},$$

-continued $$Z_{pn} = \left(\frac{Z_{pp} - Z_{sh}}{-Z_{sh}}\right)\frac{\Delta V_n}{I_p^{sh}},$$

$$Z_{mp} = \left(\frac{Z_{pp} - Z_{sh}}{-Z_{sh}}\right)\frac{\Delta V_m}{I_p^{sh}},$$

where $Z_{sh}$ is an impedance of the shunt element at the third bus prior to the trip of the shunt element,
$I_p^{sh}$ is a shunt current through the shunt element at the third bus prior to the trip of the shunt element,
$\Delta V_n$ is a change in voltage at the second bus in response to the trip of the shunt element,
$\Delta V_m$ is a change in voltage at the first bus in response to the trip of the shunt element, and
$\Delta V_p$ is a change in voltage at the third bus in response to the trip of the shunt element.

The method may comprise determining $I_p^{sh}$ from a shunt current measurement prior to the trip of the shunt element.

The method may comprise determining $I_p^{sh}$ computationally according to $$I_p^{sh} = \frac{V_p^0}{Z_{sh}}.$$

The method may comprise determining the modified bus impedance submatrix $$Z(mmp)'' = \begin{pmatrix} Z_{mm}'' & Z_{mn}'' & Z_{mp}'' \\ Z_{nm}'' & Z_{nn}'' & Z_{np}'' \\ Z_{pm}'' & Z_{pn}'' & Z_{pp}'' \end{pmatrix}$$

from the bus impedance submatrix Z(mnp) by performing series branch modifications comprising removing the branches between nodes m and p and between nodes m and n.

The method may comprise determining the updated impedances of the equivalent model of the two-port equivalent such that they fulfil $$Z_{sM} = \frac{Z_{mm}'' Z_{nn}'' - Z_{mn}'' Z_{nm}''}{Z_{nn}'' - Z_{mn}''},$$

$$Z_{sN} = \frac{Z_{mm}'' Z_{nn}'' - Z_{mn}'' Z_{nm}''}{Z_{mm}'' - Z_{mn}''},$$

$$Z_{tr}^{MN} = \frac{Z_{mm}'' Z_{nn}'' - Z_{mn}'' Z_{nm}''}{Z_{mn}''}.$$

The method may comprise determining the one or several updated impedances of the equivalent model responsive to at least one of:
a trip of the second line;
a trip of a shunt element at the third bus.

The device or system may comprise at least one integrated circuit coupled to the interface and which determines the at least one updated impedance of the equivalent model.

The interface may be communicatively coupled to a substation bus.

Impedances of the equivalent model and/or bus impedance submatrix elements obtained before the at least one trip event may be retrieved from a storage device.

The storage device may be integrated in the device or system that determines the updated impedances of the equivalent model or separate therefrom.

The device or system may be a substation device or substation system, such as a substation computer.

A method of performing at least one protection function may comprise determining the updated impedances of the equivalent model using the method of an embodiment and using the updated impedances of the equivalent model.

The updated impedances of the equivalent model may be used for at least one of:

distance relaying;

adaptive relaying;

fault location determination (such as single-ended fault location determination, without being limited thereto);

system non-homogeneity factor determination;

distance relay reach determination;

adaptive selection of phase selection methods for system protection, optionally wherein the phase selection methods comprise phasor, superimposed quantities, or travelling-wave based methods;

short circuit ratio, SCR, determination;

overcurrent relay coordination.

The device or system carrying out the method may be a protection or coordination system operative to perform at least one protection or coordination function using the updated impedances of the equivalent model.

The device or system carrying out the method may determine the one or several updated impedances of the equivalent model of the two-port equivalent across the first line responsive to a trip of the second line.

The device or system carrying out the method may determine the one or several updated impedances of the equivalent model of the two-port equivalent across the first line responsive to a trip of a shunt element at the third bus.

According to another aspect, there is provided instruction code executable by at least one processing device, in particular at least one integrated circuit of a digital substation device or a digital substation system, that causes the at least one processing device to automatically perform the method according to any embodiment.

According to another aspect, there is provided a storage medium having stored thereon instruction code executable by at least one processing device, in particular at least one integrated circuit of a digital substation device or a digital substation system, that causes the at least one processing device to automatically perform the method according to any embodiment.

The storage medium may be a non-transitory storage medium.

Various effects and advantages are attained by the devices, systems, and methods according to embodiments.

The devices, systems, and methods allow substation and/or process bus data at the line terminals and buses one level up in the topology to be used to determine updated equivalent impedances. The data may be obtained using measurement and communication infrastructure in digital substations.

The devices, systems, and methods allow updating of equivalent impedances to be performed for topological events such as incident line trip and shunt element trip at an adjacent bus.

According to embodiments, the devices, systems, and methods do not require information of short circuit levels of the terminal buses and fault current contributions from the line of concern itself to determine the updated impedances of the equivalent model.

According to embodiments, the devices, systems, and methods do not require information on staged bus faults to determine the updated impedances of the equivalent model.

According to embodiments, the devices, systems, and methods do not require information on the entire network topology information to determine the updated impedances of the equivalent model.

According to embodiments, the devices, systems, and methods afford simple and non-iterative implementation of the determination of the updated impedances of the equivalent model.

The devices, systems, and methods may be operative to use information such as the base equivalent parameters, parameters of the transmission line of interest and a tripping element (such as a second line or a shunt element at an adjacent bus) and a limited amount of voltage measurements and, optionally, current measurements in estimating an impedance submatrix thus, making the techniques suitable for the substation level. The parameters used may specifically include or be the impedances of a fundamental frequency model representation of the transmission line of interest and tripping element (such as a second line or a shunt element at an adjacent bus).

The devices, methods, and systems according to embodiments can be used in association with a three-phase transmission system, in particular for a grid having renewable energy source.

BRIEF DESCRIPTION OF THE DRAWINGS

The subject-matter will be explained in more detail with reference to preferred exemplary embodiments which are illustrated in the attached drawings, in which:

FIG. 1 is a schematic partial representation of an electric power system having a digital substation device.

FIG. 2 is a schematic partial representation of the electric power system.

FIG. 3 is a schematic representation of a two-port Thevenin equivalent across a transmission line of FIG. 2.

DETAILED DESCRIPTION OF EMBODIMENTS

Figure 4:
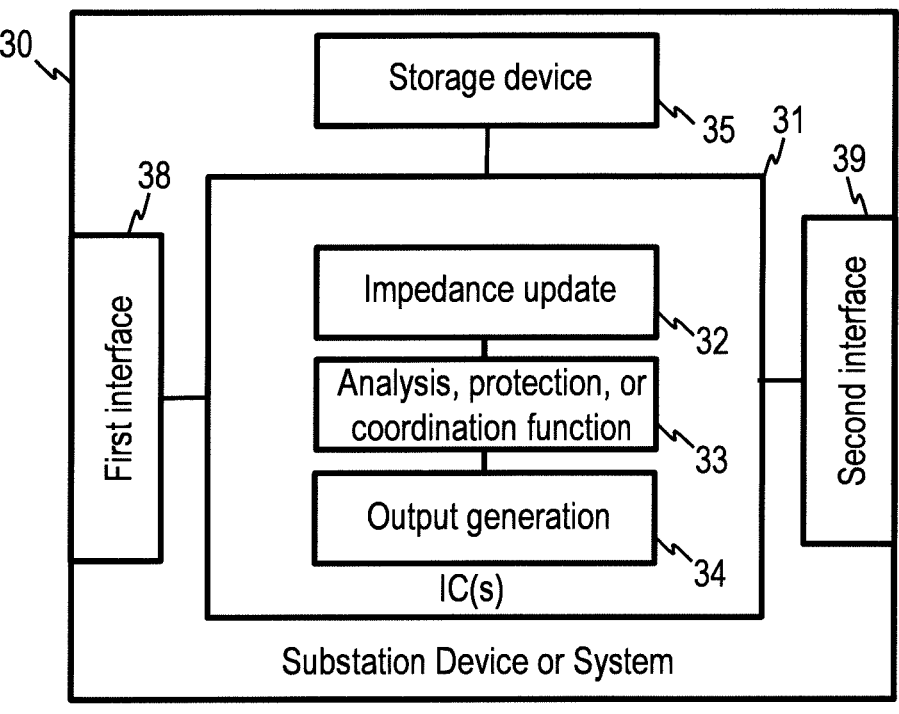
FIG. 4 is block diagram of a substation device.

Exemplary embodiments will be described with reference to the drawings in which identical or similar reference signs designate identical or similar elements. While some embodiments will be described in the context of, the methods and devices described in detail below may be used in a wide variety of systems.

The features of embodiments may be combined with each other, unless specifically noted otherwise.

According to embodiments, devices, systems, and methods are provided that are operative to perform an online update of impedances of an equivalent model (also referred to as "equivalent impedances" herein). The devices, systems, and methods may be operative to perform an online update of equivalent impedances of a two-port Thevenin equivalent across a transmission line.

The devices, systems, and methods are operative to determine updated impedances (such as two updated source impedances and an updated transfer path impedance in the two-port Thevenin equivalent across a transmission line) in response to at least following types of network topology changes:

A line incident upon one of the terminal buses of the transmission line of interest trips.

A shunt element connected at a bus adjacent to the terminal buses of the transmission line of interest trips.

The devices, systems, and methods are operative to perform the online update by using information on impedances obtained before the at least one trip event (such as impedances of the two-port Thevenin equivalent across the transmission line of interest and base impedances of the two-port Thevenin equivalent across the incident transmission line obtained before the at least one trip event) in combination with measurements. Model parameters of the line of interest and at least one of the incident line or the shunt element which trips are also used for determining the updated impedances.

The measurements required to perform the online update are from within a neighborhood of the transmission line of interest. The measurements that are used for performing the online update may include voltages (and optionally current) at the transmission line of interest, the incident line, the terminal buses of the transmission line of interest, a bus adjacent to the terminal buses of the transmission line of interest, and shunt element currents of the terminal buses of the transmission line of interest and/or the adjacent bus. Current measurements are optional. The measurements that are used for performing the online update may be limited to currents or voltages at the transmission line of interest, the incident line, the terminal buses of the transmission line of interest, a bus adjacent to the terminal buses of the transmission line of interest, and shunt element currents of the terminal buses of the transmission line of interest and/or the adjacent bus. By using measurements only from the neighborhood of the transmission line of interest, the online update of the equivalent impedances can be performed by a substation device or otherwise at the substation level, without requiring an update from a control center and/or without requiring the full impedance matrix of the complete network to be re-calculated responsive to a topology change.

As used herein, the term "measurement" is to be understood such that it does by no means preclude that processing is performed on the outputs of the sensing devices deployed. For illustration, as understood herein, "measurements of voltage changes" are intended to encompass voltage changes that are derived computationally from voltage measurements (e.g., as a difference of voltages measured before and after a trip event).

The neighborhood of the transmission line of interest from which measurements are used for determining the updated impedances may be limited to the transmission line of interest (also referred to as "first transmission line" herein), its terminal buses, an adjacent bus (also referred to as "third bus" herein), and an incident transmission line (also referred to as "second transmission line" herein), and the associated shunt elements, circuit breakers and/or switches. The updated impedances may be determined without requiring measurements outside that neighborhood.

The measurements and/or switch status information may be received in messages in accordance with a substation automation communication protocol, e.g. in messages in accordance with or compatible with IEC 61850. The measurements and/or switch status information may be received in messages in accordance with or compatible with IEC 61850:8-1, IEC 61850:8-2, and/or IEC 61850:9. The measurements and/or switch status information may be received in messages in accordance with or compatible with IEC 61850:8-1 (2011), IEC 61850:8-2 (2018), and/or IEC 61850:9 (2011) and/or IEC 61850:9/AMD1:2020 (2020).

As used herein, "determining an impedance" is to be understood to encompass the determination of a value that approximates the impedance of an equivalent model. While limiting the use of measurements to measurements available in a neighborhood of the transmission line of interest (such as substation level bus data or measurements) entails some approximations, the devices, systems, and methods according to embodiments provide updated equivalent impedances having a small error only.

FIG. 1 is a schematic partial representation of an electric power system 10 having a digital substation device 30.

The electric power system 10 has a first transmission line 11 between a first bus M and a second bus N. The first transmission line 11 is also referred to as line MN herein, because it extends between buses M and N, or as "transmission line of interest", because the equivalent impedances of this first transmission line are being updated in response to a topology change.

The electric power system 10 has a second transmission line 12 between a third bus P and the first bus M. Generally, the second transmission line 12 may be any transmission line extending between one of the terminal buses M, N of the first transmission line and a bus P that is adjacent to (e.g., one level up in the network hierarchy) one of the terminal buses M, N of the first transmission line. The second transmission line 12 will also be referred to as "incident line" herein.

Shunt elements 21, 22, 23 are provided at the buses P, M, N. The shunt elements 21, 22, 23 may be or may comprise any one or any combination of a reactor, a capacitor bank, a load impedance.

The electric power system 10 has breakers 13-19 that may selectively trip. The breakers 13-19 may be operative to provide measurements (such as current measurements) to the substation device 30. The breakers 13-19 may be operative to provide status information (tripped or untripped) to the substation device 30.

The substation device 30 may be a digital substation device communicatively coupled to other devices at the substation level. The substation device 30 may be operative to receive and/or transmit data via a substation communication bus.

The substation device 30 is operative to determine updated impedances of an equivalent model of the first transmission line 11 responsive to a trip event. The substation device 30 may be operative to determine updated impedances of an equivalent model of the first transmission line 11 responsive to a trip of the second line 12 (i.e., of the line incident upon one of the terminal buses M, N of the transmission line of interest 11);

a trip of a shunt element 21 connected at a bus P adjacent to the terminal buses M, N of the transmission line of interest 11.

The substation device 30 may be operative to perform updates of impedances of the equivalent model of the first transmission line 11 responsive to other trip events, such as a trip of the shunt element 22 or of the shunt element 23. However, the substation device 30 is preferably operative to at least perform a determination of updated impedances of the equivalent model of the first transmission line 11 in the two scenarios mentioned above.

The trip event, i.e., the change in network topology in a neighborhood of the first transmission line 11, may trigger the determination of the update process. The updated impedances may be used for any one or any combination of protection or coordination functions, as will be explained in more detail below.

Different measurements may be used, depending on the trip that occurred. All measurements used to determine the updated impedances may be obtained from, e.g., the first and second lines 11, 12 and the buses P, M, N, and the associated switches, circuit breakers, and shunt elements.

For illustration, and as will be explained more fully herein, to determine the updated impedances responsive to a trip of the second line 12, the following measurements may be used:

a change in voltage at the second bus 12 in response to the trip of the second line, and a current on the second line 12 at the first bus M before the trip of the second line, and (i) changes in voltages at the first and third buses M. P in response to the trip of the second line 12 or (ii) a current of the second line 12 measured at the first bus M before the trip of the second line 12.

For further illustration, to determine the updated impedances responsive to a trip of a shunt element at the third bus P, the following measurements may be used:

a shunt current through the shunt element at the third bus P prior to the trip of the shunt element and a change in voltage at the second bus N in response to the trip of the shunt element; optionally measurements of changes in voltages at the first and third buses M, P in response to the trip of the shunt element.

The disclosed techniques work without requiring online measurements of other quantities for performing the update of the impedances. The disclosed techniques are operative to determine the updated impedances without requiring or without using current measurements. Currents may be determined computationally.

FIG. 2 shows part of the electric power system 10 that is of interest to the update process described in detail herein. The first transmission line 11 between its terminal buses M, N is represented by an equivalent model, and the substation device 30 is operative to determine updated impedances for the equivalent model responsive to trip events. It will be appreciated that the rest 29 of the electric power system, which is shown only schematically, includes various additional transmission lines, buses, etc. The update of the impedance as described herein uses impedance values of the equivalent model that correspond to the untripped system, measurements from only a neighborhood of the first transmission line 11, and topology information from only a neighborhood of the first transmission line 11. The update of the impedance as described herein does not require topology information of parts of the electric power system that are arranged beyond the third bus P and its shunt element(s).

FIG. 3 shows the two-port Thevenin equivalent across the first transmission line 11. The equivalent system consists of two sources with corresponding impedances $Z_{sM}$ and $Z_{sN}$. Additionally, a transfer path with impedance $Z_{tr}^{MN}$ may be present which represents equivalent of the network for the current flow between buses M and N except for the direct path through the branch MN itself (which is represented by impedance $Z_l$).

Determining updated impedances for the two-port Thevenin equivalent across the first transmission line 11 comprises determining updated values for $\{Z_{sM}, Z_{sN}, Z_{tr}^{MN}\}$. Base values of the impedances of the two-port Thevenin equivalent, i.e., values for $\{Z_{sM}, Z_{sN}, Z_{tr}^{MN}\}$ of the base network (without trip of the second transmission line 12 and without trip of the shunt element at the bus P) are used in determining the updated impedances.

While the two-port Thevenin equivalent model across the first transmission line 11 is shown in FIG. 3, the two-port Thevenin equivalent across the second transmission line 12 has similar parameters $\{Z_{sM}, Z_{sP}, Z_{tr}^{MP}\}$.

As explained in more detail herein, the substation device 30 may be operative to use the impedances $\{Z_{sM}, Z_{sN}, Z_{tr}^{MN}\}$ of the two-port Thevenin equivalent across the first transmission line 11 obtained before the at least one trip event (i.e., the impedances of the initial, untripped system), measurements of a change in voltage at the second bus N responsive to the trip event, measurements of voltages at the first bus M and the third bus P before the trip event, optionally at least the following measurements:

(i) a current on the second transmission line 12 at the first bus M before the trip of the second line obtained from measurements when updating the impedances responsive to a trip of the second transmission line 12, (ii) a measurement of a shunt element current prior to trip of the shunt element 21 at the third bus P when updating the impedances responsive to a trip of the shunt element 21;

the impedances $\{Z_{sM}, Z_{sP}, Z_{tr}^{MP}\}$ of the two-port Thevenin equivalent across the second transmission line 12 obtained before the at least one trip event (i.e., the impedances of the initial, untripped system) or measurements of a change in voltage at the first bus M and at the third bus P responsive to the trip event.

The impedances $\{Z_{sM}, Z_{sN}, Z_{tr}^{MN}\}$ of the two-port Thevenin equivalent across the first transmission line 11 obtained before the at least one trip event and, if used, the impedances $\{Z_{sM}, Z_{sP}, Z_{tr}^{MP}\}$ of the two-port Thevenin equivalent across the second transmission line 12 obtained before the at least one trip event are impedance values obtained from a full network analysis (i.e., including the parts of the electric power system connected beyond the buses shown in FIGS. 1 to 3).

The device or system that determines the updated impedances during field operation may receive the impedances of the untripped system (or base impedances) as an input. This input does not need to be re-received when the impedances are re-determined several times during field operation, respectively in response to trip events. The impedances of the untripped system (or base impedances) may be persistently stored in the device or system that determines the updated impedances in field operation.

For illustration, the determination of first modified impedances during field operation in response to a first trip event (such as a first incident line trip or a first shunt element trip) and the determination of second updated impedances during field operation in response to a second trip event (such as a second incident line trip or a second shunt element trip) subsequent to the first trip event may be performed without having to re-receive impedances from a control center or otherwise.

If the second line trips (second trip event) after trip of the shunt element at the third bus (first trip event), the updated values of the two-port Thevenin equivalent impedances (post a trip event) can then be used as base impedances for any subsequent impedance update determinations (if needed).

A user or operator may obtain the impedances of the untripped system (or base impedances) as a one-time exercise from a control center (which may be a regional or main control center), which based on its access to the entire network topology data shall be capable of calculating them. Retrieval of the impedances of the untripped system (or base impedances) and providing them to the device or system that determines updated impedances may be done prior to field operation (e.g., during commissioning of an IED or system that determined the updated impedances, such as during commissioning of a substation) or during system maintenance after the device or system has entered field operation.

Updated values of the two-port Thevenin equivalent impedances (post a trip event) determined during field operation can then be used as base impedances for any subsequent updations (if needed).

As a result, the substation device 30 determines updated values for the impedances $\{Z_{sM}, Z_{sN}, Z_{tr}{}^{MN}\}$ of the two-port Thevenin equivalent across the first transmission line 11.

The updated impedances can be used for various purposes, including analysis, protection, and/or coordination functions. For illustration, the updated impedances can be used for any one or any combination of:
  improving distance relay performance,
  enabling adaptive setting features (in particular for distance relaying),
  performing single ended fault location determination,
  calculating the system non-homogeneity factor,
  distance relay reach calculation,
  adaptive switching the different phase selection methods (phasor or super imposed quantities or traveling wave based) to protect systems with high renewables; the source impedance information may be used for the adaptive switching,
  calculation of short circuit ratio (SCR),
  over current relay co-ordination.

FIG. 4 is a block diagram of a substation device or system 30 according to an embodiment. The substation device or system 30 has a first interface 38 operative to receive a measurements and, optionally, other data. The first interface 38 may be operative for communicative coupling to breakers to receive breaker status information and current measurements. The first interface 38 may be operative for communicative coupling to breakers to receive breaker status information and current measurements.

The first interface 38 may be operative to receive measurements of a voltage at the second bus N prior to and subsequent to a trip event, or other measurements that allow the substation device or system 30 to determine the change in voltage at the second bus N responsive to the trip event.

The first interface 38 may be operative to receive charging currents for the second transmission line 12 prior to a trip of the second line 12 or other measurements that allow the substation device or system 30 to determine the charging currents for the second transmission line 12 prior to the trip of the second line 12. The substation device or system 30 may be operative to process these measurements to determine updated impedances responsive to a trip of the second transmission line 12.

The first interface 38 may be operative to receive a shunt element current through the shunt element 21 prior to trip of the shunt element 21. The substation device or system 30 may be operative to process these measurements to determine updated impedances responsive to a trip of the shunt element 21.

The first interface 38 may optionally be operative to receive measurements of voltages at the first and third buses M, P prior to and subsequent to a trip event, or other measurements that allow the substation device or system 30 to determine the change in voltages at the first and third buses M, P responsive to a trip event.

The substation device or system 30 has one or several integrated circuits (IC(s)) 31 that perform processing functions. The one or several IC(s) 31 may include one or several of a processor, a microprocessor, a controller, a microcontroller, a field-programmable gate array (FPGA), an application specific integrated circuit (ASIC) or any combination thereof.

The IC(s) 31 are operative to implement an impedance update module 32. The impedance update module 32 may determine updated values for the impedances $\{Z_{sM}, Z_{sN}, Z_{tr}{}^{MN}\}$ of the two-port Thevenin equivalent across the first transmission line 11 responsive to a trip event, using any one of the processing techniques disclosed herein.

The IC(s) 31 may be operative to implement an analysis, protection, or coordination function 33. This function may also be implemented separately from the substation device 30. The analysis, protection, or coordination function 33 may be operative to perform a protection function, in particular a distance protection function. The analysis, protection, or coordination function 33 may be operative to perform various functions, such as any one or any combination of: adaptive settings (in particular for adaptive distance relaying), performing single ended fault location determination, calculating the system non-homogeneity factor, distance relay reach calculation, adaptive switching the different phase selection methods (phasor or super imposed quantities or traveling wave based) to protect systems with high renewables, calculation of short circuit ratio (SCR), over current relay co-ordination.

The IC(s) 31 may be operative to issue signals or commands via at least one second interface 39 to cause a determined action to be taken, a determined setting to be applied, or determined information to be output.

The IC(s) 31 may be operative to implement an output generation module 34. The output generation module 34 may cause output (alarms, warning, notifications, or other information) to be output to an operator, e.g., to a substation operator.

Information on the impedances $\{Z_{sM}, Z_N, Z_{tr}{}^{MN}\}$ of the equivalent model across the first transmission line 11 obtained before the at least one trip event, on the line impedance $Z_l$ of the direct connection MN (see FIG. 3), and, where applicable, on the on the impedances $\{Z_{sM}, Z_{sP}, Z_{tr}{}^{MP}\}$ of the equivalent model across the second transmission line 12 obtained before the at least one trip event, on the line impedance $Z_l$ of the direct connection MP (note that this impedance may be different from the line impedance of the direct connection MN), and on the impedance of the shunt element(s) that can trip may be stored in a storage device 35 and may be retrieved therefrom for processing by the IC(s) 31. The storage device 35 may be integrated in the substation device 30 or may be provided separately therefrom.

Figure 5:
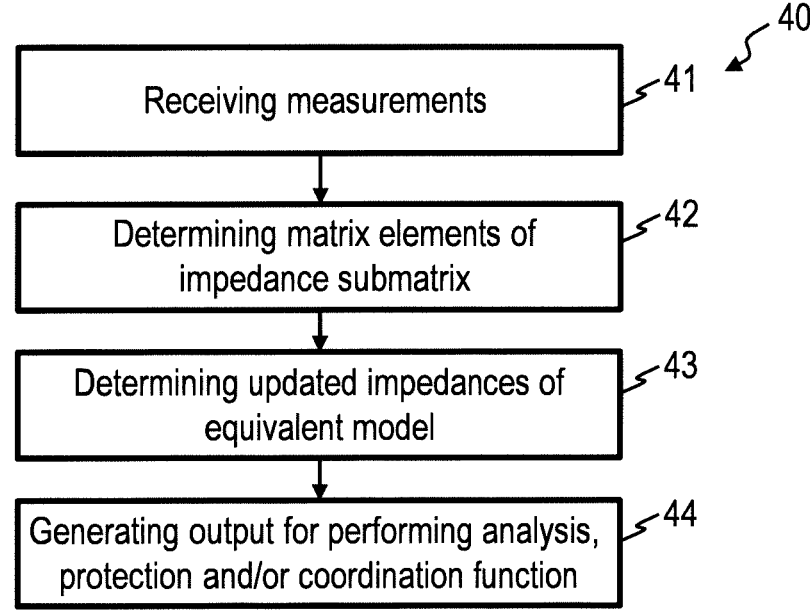
FIG. 5 is a flow chart of a method.

FIG. 5 is a flow chart of a method 40. The method 40 may be performed automatically by the substation device or system 30.

At step 41, measurements are received. The measurements may comprise voltage measurements. The voltage measurements may comprise a change in voltage at one or several of the buses N, M, and P responsive to a trip event. Determination of the change in voltage may be performed by the substation device or system 30 or by a separate entity.

At step 42, matrix elements of an impedance submatrix are determined. The impedance submatrix may be a 3×3 matrix. The impedance submatrix may be a 3×3 submatrix of the bus impedance matrix. Some of the matrix elements of the impedance submatrix may be determined from the impedance values $\{Z_{sM}, Z_{sN}, Z_{tr}^{MN}\}$ of the two-port Thevenin equivalent across the first transmission line 11 obtained before the at least one trip event. At least one of the matrix elements of the impedance submatrix may be determined using the received measurements. The remaining matrix elements of the impedance submatrix may be determined from the impedances $\{Z_{sM}, Z_{sP}, Z_{tr}^{MP}\}$ of the two-port Thevenin equivalent across the second transmission line 12 obtained before the at least one trip event or using the received measurements.

At step 43, updated impedances $\{Z_{sM}, Z_{sN}, Z_{tr}^{MN}\}$ of the two-port Thevenin equivalent across the first transmission line 11 are determined, using the impedance submatrix determined at step 42.

At step 44, output is generated based on the updated impedances to perform an analysis, protection, and/or coordination function.

The method may comprise performing an analysis, protection, and/or coordination function. The analysis, protection, and/or coordination function may comprise any one or any combination of adaptive settings (in particular for adaptive distance relaying), performing single ended fault location determination, calculating the system non-homogeneity factor, distance relay reach calculation, adaptive switching the different phase selection methods (phasor or super imposed quantities or traveling wave based) to protect systems with high renewables, calculation of short circuit ratio (SCR), over current relay co-ordination.

The device or method requires online information from only a neighborhood of substation level measurements to provide an online update of the two-port equivalent. The device or method use information of lines and buses adjacent to the line of interest, i.e., network information of the adjacent topology, to update the two-port equivalent model across the line of interest. The effect of topology changes in the neighborhood of the line of interest can be accounted for by updating its two-port equivalent.

The device or method consider tripping-off of the line 12 incident on one of the terminal buses M of the line 11 of concern or tripping-off of a shunt element 21 (reactor/capacitor) at a bus P one level up (i.e. an adjacent bus) in the topology. The device or method perform the update of the impedances without requiring the bus impedance matrix $Z_{BUS}$ of the full electric power system 10 to be updated and uses only local update information which may be available as substation process bus level measurements and data. This local measurements and data may be the bus voltage measurements at both ends of the line of concern, currents on the lines incident on the terminal buses, currents through the connected shunt elements and model parameters of the line and the neighboring elements, i.e. incident lines and adjacent shunt elements. The device or method may utilize measurements related to the switching event and parameters of the line of concern and the tripped element for updating the two-port equivalent. Current measurements are optional. For illustration, currents may also be computed, as explained in more detail herein.

The device or method may utilize digital substation measurements at both ends of the transmission line 11 and substations one level up in the network. For example, for the system of FIGS. 1 to 3 in which the line of interest is the line 11 between buses M and N, the substation device 30 has access to measurements from the substations M, N and P. The symbol P is indicative of any bus one level up in the network topology with respect to the line of interest 11. Model parameters of the line of interest and all incident elements (such as lines incident on one of the terminal buses and shunt elements connected to any bus one level up in the network topology) are also available to the substation device 30.

The device or method may determine or otherwise process matrix elements of an impedance submatrix. The impedance submatrix may be a submatrix of the full impedance matrix $Z_{bus}$ of the electric power network.

The device or method may process one or several of the following submatrices of the bus impedance matrix $Z_{bus}$ of the full electric power network:

$$Z(mnp) = \begin{pmatrix} Z_{mm} & Z_{mn} & Z_{mp} \\ Z_{nm} & Z_{nn} & Z_{np} \\ Z_{pm} & Z_{pn} & Z_{pp} \end{pmatrix}, \tag{1}$$

$$Z(mnp)' = \begin{pmatrix} Z'_{mm} & Z'_{mn} & Z'_{mp} \\ Z'_{nm} & Z'_{nn} & Z'_{np} \\ Z'_{pm} & Z'_{pn} & Z'_{pp} \end{pmatrix}$$

$$Z(mnp)'' = \begin{pmatrix} Z''_{mm} & Z''_{mn} & Z''_{mp} \\ Z''_{nm} & Z''_{nn} & Z''_{np} \\ Z''_{pm} & Z''_{pn} & Z''_{pp} \end{pmatrix}.$$

Z(mnp) represents the impedance submatrix bus impedance matrix $Z_{bus}$ of the full electric power network which consists of only the nine elements corresponding to nodes M, N and P.

The impedance submatrix Z(mnp)' corresponds to the network from which the branch between node M and N is removed.

The impedance submatrix Z(mnp)" corresponds to the network from which the branch between nodes M and N and the tripped element are removed.

For example, for the case in which the line between Bus M and P trips, Z(mnp)" is the impedance submatrix of the of the $Z_{bus}$ of the network without the line between buses M and N and the line between buses M and P.

An admittance matrix $Y_{bus}$ of the two-port equivalent network (FIG. 3) without the line MN (i.e., without the impedance $Z_l$ in FIG. 3) can be represented by $$Y_{bus}^{MN} = \begin{pmatrix} \frac{1}{Z_{sM}} + \frac{1}{Z_{tr}^{MN}} & \frac{-1}{Z_{tr}^{MN}} \\ \frac{-1}{Z_{tr}^{MN}} & \frac{1}{Z_{sN}} + \frac{1}{Z_{tr}^{MN}} \end{pmatrix} = \begin{pmatrix} Z'_{mm} & Z'_{mn} \\ Z'_{nm} & Z'_{nn} \end{pmatrix}^{-1}. \tag{2}$$

Dependence of the Updated Impedances of the Two-Port Equivalent from the Impedance Submatrix From the above relationship, impedances of the two-port equivalent across line M and N in the base network can be obtained as:

$$Z_{sM} = \frac{Z'_{mm}Z'_{nn} - Z'_{mn}Z'_{nm}}{Z'_{nn} - Z'_{mn}},$$

$$Z_{sN} = \frac{Z'_{mm}Z'_{nn} - Z'_{mn}Z'_{nm}}{Z'_{mm} - Z'_{mn}},$$

$$Z_{tr}^{MN} = \frac{Z'_{mm}Z'_{nn} - Z'_{mn}Z'_{nm}}{Z'_{mn}}. \tag{3}$$

Extending this to a network from which the tripped element is removed, the two-port equivalent across line M and N in the modified network can be obtained as:

$$Z_{sM} = \frac{Z''_{mm}Z''_{nn} - Z''_{mn}Z''_{nm}}{Z''_{nn} - Z''_{mn}},$$

$$Z_{sN} = \frac{Z''_{mm}Z''_{nn} - Z''_{mn}Z''_{nm}}{Z''_{mm} - Z''_{mn}},$$

$$Z_{tr}^{MN} = \frac{Z''_{mm}Z''_{nn} - Z''_{mn}Z''_{nm}}{Z''_{mn}}. \tag{4}$$

Therefore, the device or method can establish the impedance submatrix $Z(mnp)''$ and can determine the updated impedances of the two-port equivalent model of the transmission line 11 using Equation (4).

Using Relations Between the Elements of Z(Mnp), Z(Mnp)' and Z(Mnp)"

The elements of $Z(mnp)$, $Z(mnp)'$ and $Z(mnp)''$ are related. This is because $Z(mnp)'$ can be obtained from $Z(mnp)$ by performing series and shunt branch (corresponding to the series impedance and shunt admittances of line MN) modifications on $Z(mnp)$.

The network impedance submatrix $Z(ijk)$ corresponding to nodes i, j and k is given by Equation (5) below.

$$Z(ijk) = \begin{pmatrix} Z_{ii} & Z_{ij} & Z_{ik} \\ Z_{ji} & Z_{jj} & Z_{jk} \\ Z_{ki} & Z_{kj} & Z_{kk} \end{pmatrix} \tag{5}$$

When a new branch with impedance $Z_{br}$ is added to the network in series between buses i and j, the following formula can be used to obtain the new $Z(ijk)$ submatrix, $$Z(ijk)_{new} = Z(ijk) - \frac{\{Z_{ij}\}\{Z_{ij}\}^T}{\Delta_{ij}} \tag{6}$$

where $\{Z_{ij}\}$ represents the vector difference between the $i_{th}$ and $j_{th}$ columns of $Z(ijk)$ and the entity $\Delta_{ij} = Z_{ii} + Z_{jj} - 2Z_{ij} + Z_{br}$. A corresponding formula can be used in case a branch with impedance $Z_{br}$ between buses i and j is removed from the network, by using $-Z_{br}$ in place of $+Z_{br}$ in the formula for $\Delta_{ij}$.

When a shunt element of impedance $Z_{sh}$ is added to the network at bus i, the following equation can be used to obtain the new $Z(ijk)$ submatrix $$Z(ijk)_{new} = Z(ijk) - \frac{\{Z_i\}\{Z_i\}^T}{\Delta_{ii}} \tag{7}$$

where $\{Z_i\}$ represents the $i_{th}$ column of $Z(ijk)$ and the entity $\Delta_{ii} = Z_{ii} - Z_{sh}$. A corresponding formula can be used in case a shunt element with impedance $Z_{sh}$ at bus i is removed from the network, by keeping $-Z_{sh}$ in place of $+Z_{sh}$ in the formula for $\Delta_{ii}$.

The formulae for series (6) and shunt branch (7) modifications may be used by the substation device and method according to embodiments to determine $Z(mnp)''$ from $Z(mnp)$.

The substation device and method according to embodiments may be operative to determine $Z(mnp)$ (using the impedance values obtained before the at least one trip event that are available and the measurements that are available; exemplary techniques are described below with reference to FIGS. 6 to 15);

determine $Z(mnp)''$ from $Z(mnp)$ in accordance with Equation (6) (trip of an incident line) or Equation 7 (trip of shunt element at incident bus); and determine the updated impedances $\{Z_{sM}, Z_{sN}, Z_{tr}^{MN}\}$ of the two-port Thevenin equivalent across the first transmission line 11

Obtaining the Elements of the Impedance Submatrix Z(mnp)

The device or method may use the impedance parameters of the two-port equivalent across lines MN and MP in the base network (i.e., the impedances of the two-port equivalent $\{Z_{sM}, Z_{sN}, Z_{tr}^{MN}\}$ for the equivalent model across the first transmission line 11 obtained before the at least one trip event and the impedances of the two-port equivalent $\{Z_{sM}, Z_{sP}, Z_{tr}^{MP}\}$ for the equivalent model across the second transmission line 12 obtained before the at least one trip event), device or method can obtain all elements of $Z(mnp)$ except for $Z_{pn} (=Z_{np})$. As will be explained further below, in still other embodiments, it is not required that the impedances of the two-port equivalent $\{Z_{sM}, Z_{sP}, Z_{tr}^{MP}\}$ for the equivalent model across the second transmission line 12 are known when more measurements are available.

A consequence of the relationship (3) is that if the parameter set $\{Z_{sM}, Z_{sN}, Z_{tr}^{MN}\}$ (impedances of the of the two-port equivalent across the first transmission line 11) are known for the base network (i.e., prior to the trip event), the elements $Z'_{mm}, Z'_{mn}, Z'_{nm}$ and $Z'_{nn}$ can be obtained in accordance with Equation (8):

$$Z(mn)' = \begin{pmatrix} Z'_{mm} & Z'_{mn} \\ Z'_{nm} & Z'_{nn} \end{pmatrix} = \begin{pmatrix} \frac{1}{Z_{sM}} + \frac{1}{Z_{tr}^{MN}} & \frac{-1}{Z_{tr}^{MN}} \\ \frac{-1}{Z_{tr}^{MN}} & \frac{1}{Z_{sN}} + \frac{1}{Z_{tr}^{MN}} \end{pmatrix} \Rightarrow Z'_{mm} = \tag{8}$$

$$\frac{Y_{sN} + Y_{tr}^{MN}}{Y_{sM}Y_{sN} + Y_{tr}^{MN}(Y_{sM} + Y_{sN})},$$

-continued $$Z'_{nn} = \frac{Y_{sM} + Y_{tr}^{MN}}{Y_{sM} Y_{sN} + Y_{tr}^{MN}(Y_{sM} + Y_{sN})} \text{ and}$$

$$Z'_{mn} = Z'_{nm} = \frac{Y_{tr}^{MN}}{Y_{sM} Y_{sN} + Y_{tr}^{MN}(Y_{sM} + Y_{sN})}.$$

where $Y_{sM} = \frac{1}{Z_{sM}}, Y_{sN} = \frac{1}{Z_{sN}}, Y_{tr}^{MN} = \frac{1}{Z_{tr}^{MN}}$ Once the substation device or method according to an embodiment obtains the impedance submatrix elements $Z'_{mm}, Z'_{nn},$ and $Z'_{mn},$ the elements $Z_{mm}, Z_{mn}, Z_{nm}$ and $Z_{nn}$ can be obtained by carrying out the modification calculations on Z(mn)' pertaining to addition of the line MN between buses M and N as explained with reference to Equation (6) Similarly, using the parameter set $\{Z_{sM}, Z_{sP}, Z_{tr}^{MP}\}$ for the base network, the substation device or method according to an embodiment can obtain $Z_{mp}, Z_{pm}$ and $Z_{pp}$ following the same procedures.

Thus, the substation device or method can obtain all elements of Z(mnp) except for $Z_{np}$ and $Z_{pn}$ if the initial parameter sets of $\{Z_{sM}, Z_{sN}, Z_{tr}^{MN}\}$ and $\{Z_{sM}, Z_{sP}, Z_{tr}^{MP}\}$ are accessible (e.g., from storage device 35).

The substation device or method are operative to obtain $Z_{np}$ and $Z_{pn}$ from the available substation measurements. As the impedance matrix $Z_{bus}$ of the full electric power network and any of its submatrices are always symmetric, $Z_{np}=Z_{pn}.$ Various techniques for determining $Z_{np}$ (and thus $Z_{pn}$) are discussed in detail below.

Figure 7:
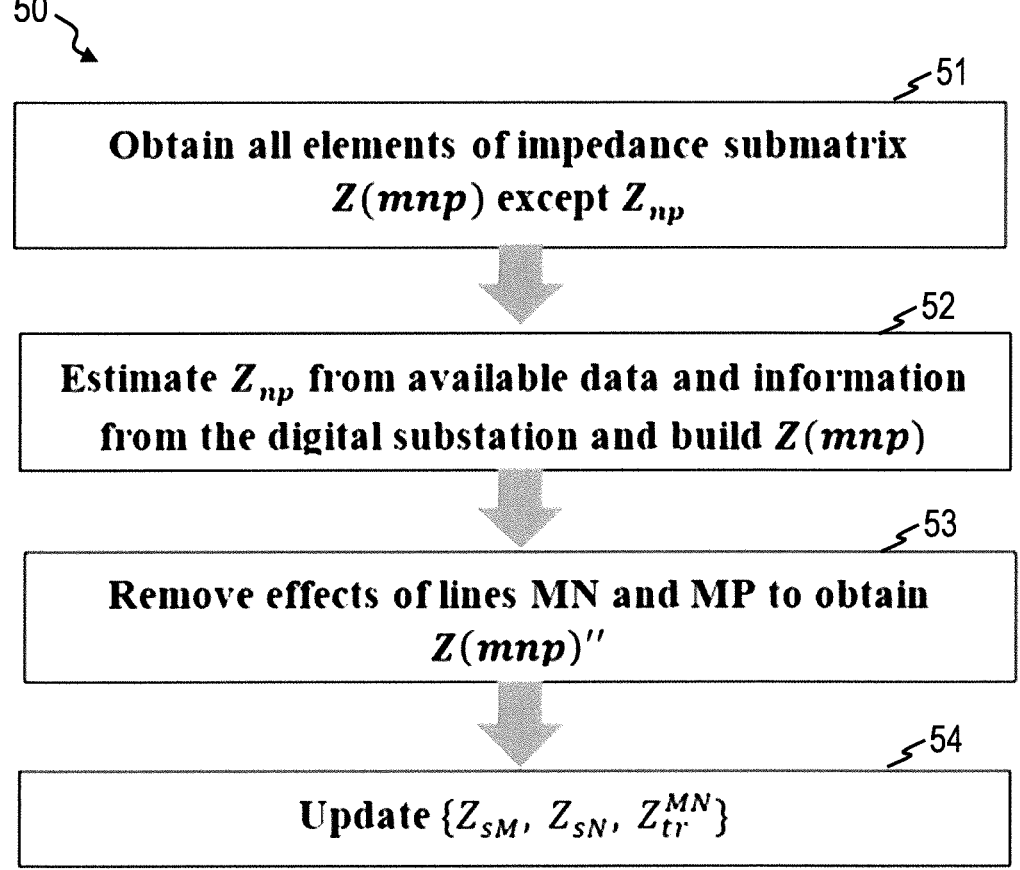
FIG. 7 is a flow chart of a method.

FIG. 7 is a flow chart of a method 50. The method may be performed automatically by the device 30.

At step 51, matrix elements of the bus impedance submatrix Z(mnp) are obtained. The matrix elements may be obtained from the initial parameter set of $\{Z_{sM}, Z_{sN}, Z_{tr}^{MN}\}$ and, optionally, $\{Z_{sM}, Z_{sP}, Z_{tr}^{MP}\},$ and parameters of the line(s) (such as shunt impedances).

At step 52, the matrix elements $Z_{np}=Z_{pn}$ may be determined using measurements available at the substation bus level. Implementations for determining these matrix elements are described in detail below.

At step 53, the impedance submatrix Z(mnp)'' is determined from the impedance submatrix Z(mnp) by performing modification computations (Equations (6) and (7)).

At step 54, the updated parameter set of $\{Z_{sM}, Z_{sN}, Z_{tr}^{MN}\}$ is determined from the impedance submatrix Z(mnp)'' in accordance with Equation (4).

Figure 6:
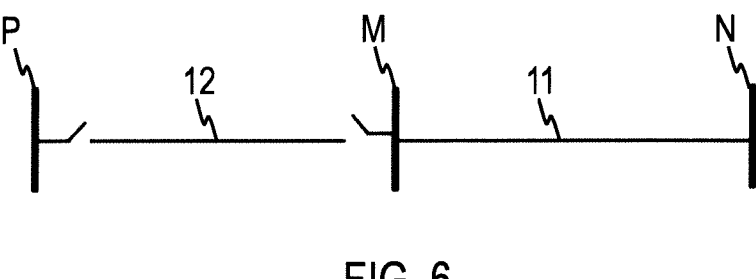
FIG. 6 is a single-line diagram after an incident line trip.

The method may further comprise performing an analysis, protection, or coordination function based on the updated parameter set of $\{Z_{sM}, Z_{sN}, Z_{tr}^{MN}\}.$ Determining $Z_{np}$ and Updated Impedance Values for Incident Line Trip This scenario corresponds to the situation in which the system is operating in (quasi-) steady state and following some event (e.g. a short-circuit fault), the second transmission line 12 (i.e., the line between buses MP) trips leading the system into a new operating condition. At this new operating condition, the two port equivalent parameters for the first line 11, i.e., transmission line between the buses MN, have changed and are to be updated. FIG. 6 shows the single line diagram after the trip.

The determination of the matrix elements $Z_{np}=Z_{pn}$ may use one, several or all the following inputs:

(i) impedances $\{Z_{sM}, Z_{sN}, Z_{tr}^{MN}\}$ of the two-port equivalent across the first transmission line 11 obtained before the at least one trip event (i.e., the initial impedances prior to the trip); optionally, the impedances $\{Z_{sM}, Z_{sP},$ $Z_{tr}^{MP}\}$ of the two-port equivalent across the second transmission line 12 obtained before the at least one trip event (i.e., the initial impedances prior to the trip);

(ii) voltage measurements at the second bus N, and optionally voltage measurements at the buses M and P;

(iii) optionally current measurement of the incident line MP (i.e., of the second line 12) at the first bus M;

(iv) parameters of the first line 11 between buses M and N and/or of the second line 12 between buses M and P (such as the shunt element impedance of shunt elements at the second line 12 that tripped);

(v) breaker status signals of the incident line MP (i.e., of the second line 12)

For the remainder of this section, it will be assumed for convenience that the impedance submatrix Z(mnp)' corresponds to the network from which the line MP is removed from the base network. The impedance submatrix Z(mnp)'' corresponds to the network from which the line MN is also removed. Note that the elements of Z(mnp)'' will remain the same as before, because only the sequence of removal of lines from the base network is changed.

Figure 9:
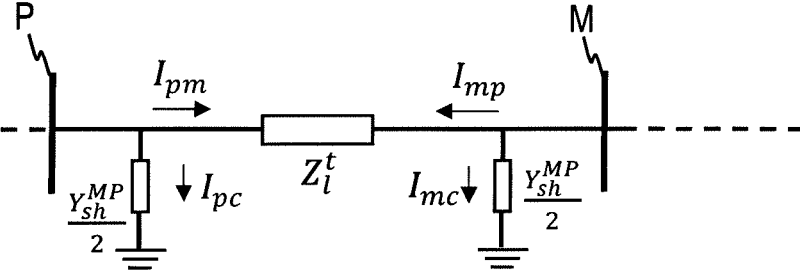
FIG. 9 is a single-line diagram showing currents prior to the incident line trip.

The current flow on the line MP can be considered as current injections at buses M and P of the system without the line MP physically present in the network as depicted in FIG. 9.

In FIG. 9, $I_{mp}$ and $I_{pm}$ are load currents of the line MP. $I_{mc}$ is a charging current of line MP at bus M. $I_{mp}$ is a charging current of line MP at bus P.

Figure 10:
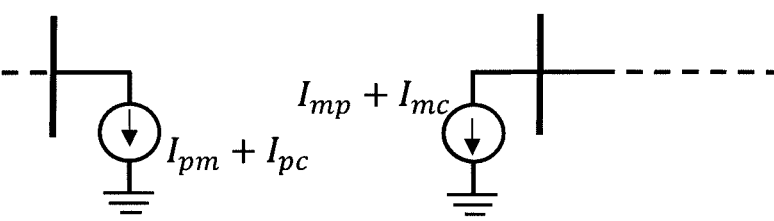
FIG. 10 is a single-line diagram showing an equivalent of the system shown in FIG. 9.

Therefore, tripping of line MP can be considered as a change in current injections at bus M and bus P for the system without the line MP, as shown in FIG. 10. Thus, for the line MP trip, the voltage change (i.e., the difference between the voltage prior and subsequent to the trip) at bus N can be written as follows:

$$\Delta V_n = (I_{mp} + I_{mc})Z'_{pn} + (I_{pm} + I_{pc})Z'_{pn} = \qquad (9)$$

$$(Z'_{mn} - Z'_{pn})(I_{mp} + I_{mc}) + (I_{mc} + I_{pc})Z'_{pn} \Rightarrow \frac{\Delta V_n}{(I_{mp} + I_{mc})} =$$

$$(Z'_{mn} - Z'_{pn}) + \frac{(I_{mc} + I_{pc})}{(I_{mp} + I_{mc})}Z'_{pn}$$

$I_{mc}$ is a charging current of the second line at the first bus before the trip of the second line (which may be calculated), $I_{pc}$ is a charging current of the second line at the second bus before the trip of the second line (which may be calculated) and $I_{mp}+I_{mc}$ is a current measured on the second line at the first bus before the trip of the second line (which may be measured or computationally derived from measurements).

The currents may be calculated using the following relations:

$$I_{mc} = \frac{V_m^0}{Z_{sh}^t}, I_{pc} = \frac{V_p^0}{Z_{sh}^t} \qquad (E1)$$

$$I_{mp} + I_{mc} = \frac{V_m^0 - V_p^0}{z_l^t} + \frac{V_m^0}{Z_{sh}^t} \qquad (E2)$$

where $V_m^0$ and $V_p^0$ are the voltages measured at bus M and bus P respectively before occurrence of the trip event and $Z_{sh}^t$ is an impedance associated with the charging current of the tripped second line, $Z_l^t$ is series impedance of the tripped second line. As explained above, the elements of submatrix Z(mnp)' are related to the elements of Z(mnp) by means of series and shunt branch modifications pertaining to the line MP. The right-hand side of the expression (9) can be written completely in terms of elements of Z(mnp). This results in an equation with $Z_{pn}$ as the variable since the quantity on the left-hand side can be obtained from measurements.

The resulting equation is linear in nature and can be solved conveniently to find $Z_{pn}$, in accordance with the following:

$$Z_{np} = Z_{pn} = \frac{\left(D(Z_{nm} - A + BE) + \frac{kEZ_{sh}^t}{Z_d - Z_{sh}^t}\right) - \frac{\Delta V_n}{(I_{mp} + I_{mc})}}{D(1 + B) + kZ_{sh}^t/(Z_d - Z_{sh}^t)}, \quad (10)$$

where:

$$A = \frac{Z_{nm}(Z_{mn} - Z_{mp})}{Z_{mm} - Z_{sh}^t},$$

$$F = Z_{mp} - Z_{pp} - \frac{Z_{mp}(Z_{mn} - Z_{mp})}{Z_{mm} - Z_{sh}^t},$$

$$Z_d = Z_{pp} - \frac{Z_{mm}^2}{Z_{mm} - Z_{sh}^t},$$

$$x_d = Z_{mn}\left(-\frac{Z_{sh}^t}{Z_{mm} - Z_{sh}^t}\right),$$

$$X = F\left(-\frac{Z_{sh}^t}{Z_{mm} - Z_{sh}^t}\right),$$

$$Z = (Z_{mn} - Z_{mp})\left(-\frac{Z_{sh}^t}{Z_{mm} - Z_{sh}^t}\right) - \frac{x_d F}{Z_d - Z_{sh}^t},$$

$$\delta = Z - X - Z_l^t,$$

$$B = \frac{F}{Z_d - Z_{sh}^t},$$

$$C = -\frac{Z_l^t}{\delta},$$

$$D = C - \frac{kX}{\delta},$$

$$E = Z_{mp}Z_{mn}/(Z_{mn} - Z_{sh}^t),$$

$$k = (I_{mc} + I_{pc})/(I_{mp} + I_{mc}),$$

where:
$Z_{sh}^t$ is an impedance associated with the charging current of the tripped second line,
$Z_l^t$ is a series impedance of the tripped second line,
$\Delta V_n$ is a change in voltage at the second bus in response to the trip of the second line,
$I_{mc}$ is a charging current of the second line at the first bus before the trip of the second line which may be calculated), $I_{pc}$ is a charging current of the second line at the second bus before the trip of the second line (which may be calculated), and $I_{mp} + I_{mc}$ is a current measured on the second line at the first bus before the trip of the second line.

The currents that are calculated may be calculated as explained above with reference to Equations (E1) and (E2).

At least $Z_{mp}$, $Z_{pm}$, and $Z_{pp}$ may be determined using impedances of the equivalent model of the two-port equivalent obtained before the at least one trip event and modification calculations (Equation (6)).

Determining Updated Impedance Values for Incident Line Trip (First Technique)

Thus, the device or method according to an embodiment can determine the updated impedance values for an incident line trip as follows:
obtaining Z(mn) (i.e., $Z_{mm}$, $Z_{nn}$, and $Z_{mn}=Z_{nm}$) by using the impedance parameters of the two-port equivalent across the first line 11 (line MN) in the base network before the trip event and modification calculations pertaining to addition of line MN (Equations (5) and (6));
obtaining Z(mp) (i.e., $Z_{pp}$, and $Z_{mp}=Z_{pm}$) b by using the impedance parameters of the two-port equivalent across the incident line 12 (i.e., line MP) in the base network and modification calculations pertaining to addition of line MP (Equations (5) and (6));
obtaining the measured voltages at buses M, P before the line trip and calculating the charging currents on the incident line 12 (i.e., line MP) using Equation (E1) and therefore the sum of charging currents; obtaining the current measured on the incident line 12 at bus M before it tripped or calculating the same using (E2).
obtaining the measured voltage change at bus N due to the line trip and using Equation (10) to determine $Z_{pn}$; once $Z_{pn}$ is obtained, all elements of Z(mnp) are identified.
removing the effects of line MN and MP from Z(mnp) using the necessary series and shunt modification calculations to obtain Z(mnp)" (Equations (6) and (7));
determining the updated equivalent impedances {$Z_{sM}$, $Z_{sN}$, $Z_{tr}^{MN}$} of the two-port equivalent across the first transmission line 11 from Z(mnp)" (Equation (4)).

Figure 8:
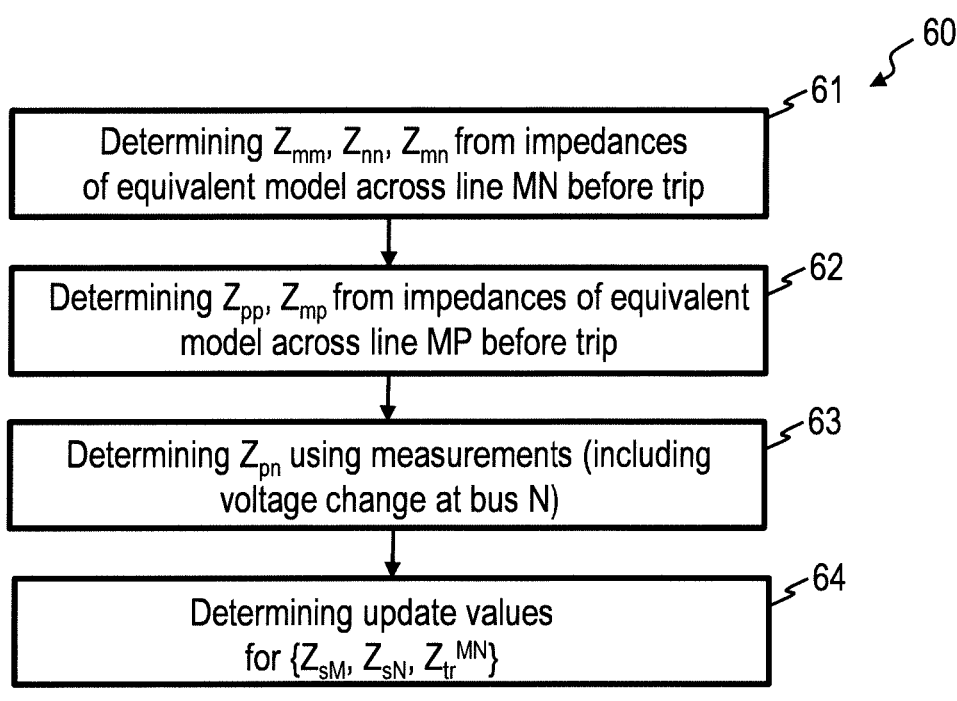
FIG. 8 is a flow chart of a method.

FIG. 8 is a flow chart of a method 60. The method may be performed automatically by the device 30.

At step 61, matrix elements $Z_{mm}$, $Z_{nn}$, and $Z_{mn}=Z_{nm}$ of the bus impedance submatrix Z(mnp) are obtained. The matrix elements may be obtained from the initial parameter set of {$Z_{sM}$, $Z_{sN}$, $Z_{tr}^{MN}$}, the line impedance $Z_l$ of the line MN, and the modification calculations of Equation (6).

At step 62, matrix elements $Z_{pp}$ and $Z_{mp}=Z_{pm}$ of the bus impedance submatrix Z(mnp) are obtained. The matrix elements may be obtained from the initial parameter set of {$Z_{sM}$, $Z_{sP}$, $Z_{tr}^{MP}$}, and parameters of the line MP (such as its line impedance $Z_l^t$).

At step 63, the matrix elements $Z_{np}=Z_{pn}$ may be determined using measurements available at the substation bus level, for example based on Equation (10).

At step 64, the updated parameter set of {$Z_{sM}$, $Z_{sN}$, $Z_{tr}^{MN}$} is determined. This may comprise determining the impedance submatrix Z(mnp)" from the impedance submatrix Z(mnp) by performing modification computations (Equations (6) and (7)), and determining the updated parameter set of {$Z_{sM}$, $Z_{sN}$, $Z_{tr}^{MN}$} from the impedance submatrix Z(mnp)" in accordance with Equation (4).

The method may further comprise performing an analysis, protection, or coordination function based on the updated parameter set of {$Z_{sM}$, $Z_{sN}$, $Z_{tr}^{MN}$}.

Determining Updated Impedance Values for Incident Line Trip (Second Technique)

Various modifications are possible to the processing of measurements described above, in order to determine the updated parameter set of {$Z_{sM}$, $Z_{sN}$, $Z_{tr}^{MN}$}.

For illustration, similarly to Equation (9), similar expressions can be derived for buses M and P as follows:

$$\frac{\Delta V_m}{(I_{mp} + I_{mc})} = (Z_{mn}' - Z_{pm}') + \frac{(I_{mc} + I_{pc})}{(I_{mp} + I_{mc})}Z_{pm}' \quad (11)$$

-continued $$\frac{\Delta V_p}{(I_{mp} + I_{mc})} = (Z'_{mp} - Z'_{pp}) + \frac{(I_{mc} + I_{pc})}{(I_{mp} + I_{mc})} Z'_{pp} \quad (12)$$

$I_{mc}$ is a charging current of the second line at the first bus before the trip of the second line (which may be calculated), $I_{pc}$ is a charging current of the second line at the second bus before the trip of the second line (which may be calculated), and $I_{mp} + I_{mc}$ is a current measured on the second line at the first bus before the trip of the second line (which may be measured or computationally derived from measurements).

The currents that are calculated may be calculated as explained above with reference to Equations (E1) and (E2).

If the ratio of the charging current to the load current on Line MP is small, Equations (9), (11) and (12) can be approximated as follows:

$$\frac{\Delta V_n}{(I_{mp} + I_{mc})} \approx (Z'_{mn} - Z'_{pn}) \quad (13)$$

$$\frac{\Delta V_m}{(I_{mp} + I_{mc})} \approx (Z'_{mm} - Z'_{pm}),$$

$$\frac{\Delta V_p}{(I_{mp} + I_{mc})} \approx (Z'_{mp} - Z'_{pp}).$$

Considering the Line MP as only a series branch of impedance $Z_l^t$ (since shunt admittances are already assumed negligible), the following relationships between elements of Z(mnp) and Z(mnp)' is obtained:

$$Z'_{mm} - Z'_{mp} = (Z_{mm} - Z_{mp}) \times \left( \frac{-Z_l^t}{Z_{mn} + Z_{pp} - 2Z_{mp} - Z_l^t} \right) \quad (14)$$

$$Z'_{nm} - Z'_{np} = (Z_{nm} - Z_{np}) \times \left( \frac{-Z_l^t}{Z_{mn} + Z_{pp} - 2Z_{mp} - Z_l^t} \right)$$

$$Z'_{pm} - Z'_{pp} = (Z_{pm} - Z_{pp}) \times \left( \frac{-Z_l^t}{Z_{mn} + Z_{pp} - 2Z_{mp} - Z_l^t} \right).$$

Equations (13) and (14) can be solved simultaneously to obtain $(Z_{mm} - Z_{mp})$, $(Z_{nm} - Z_{np})$ and $(Z_{pm} - Z_{pp})$ as shown in (15) below.

$$(Z_{mm} - Z_{mp}) = \eta \frac{\Delta V_m}{(I_{mp} + I_{mc})}, \quad (15)$$

$$(Z_{nm} - Z_{np}) = \eta \frac{\Delta V_n}{(I_{mp} + I_{mc})},$$

$$(Z_{pm} - Z_{pp}) = \eta \frac{\Delta V_p}{(I_{mp} + I_{mc})}$$

$$\text{where } \frac{1}{\eta} = \left( 1 + \left( 1 - \frac{\Delta V_p}{\Delta V_m} \right) \frac{\Delta V_m}{(I_{mp} + I_{mc})} \right) \Big/ Z_l^t.$$

Thus, after having obtained the information on $Z_{mm}$ and $Z_{nm}$, the device or method according to embodiments can obtain $Z_{mp}$, $Z_{np}$ and $Z_{pp}$ without requiring the equivalent impedance parameters of Line MP before the trip event. Thus, this technique provides an alternative to the solution described with reference to Equation (10) above. The present technique is based on the simplifying approximation that charging current of Line MP is negligible in comparison to the line loading current.

Thus, the device or method according to an embodiment can determine the updated impedance values for an incident line trip as follows:

obtaining Z(mn) (i.e., $Z_{mm}$, $Z_{nn}$, and $Z_{mn} = Z_{nm}$) by using the impedance parameters of the two-port equivalent across the first line 11 (line MN) in the base network before the trip event and modification calculations pertaining to addition of line MN (Equations (5) and (6));

obtaining the change in voltage of buses M, N and P due to the trip of the line 12 (i.e., the incident line between buses M and P); and either obtaining the current on the line MP at bus M end from a measurement or computationally using Equation (E2);

solving (1) and using Z(mn) to obtain $Z_{mp}$, $Z_{np}$ and $Z_{pp}$ and construct Z(mnp);

sequentially removing the effects of line MN and MP from Z(mnp) using the necessary series and shunt modification calculations to obtain Z(mnp)" (Equations (6) and (7));

determining the updated equivalent impedances $\{Z_{sM}, Z_{sN}, Z_{tr}^{MN}\}$ of the two-port equivalent across the first transmission line 11 from Z(mnp)" (Equation (4)).

Figure 11:
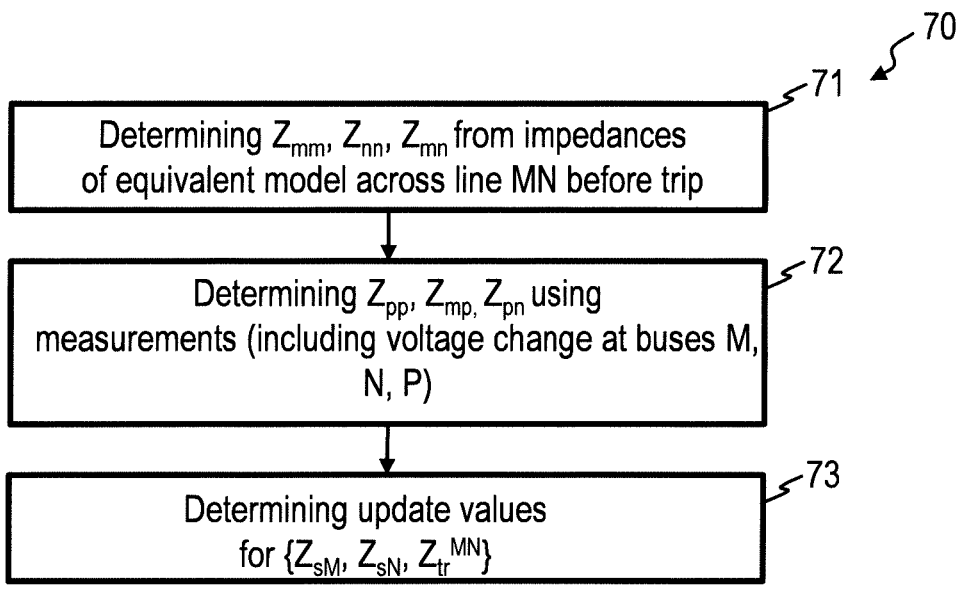
FIG. 11 is a flow chart of a method.

FIG. 11 is a flow chart of a method 70. The method may be performed automatically by the device 30.

At step 71, matrix elements $Z_{mm}$, $Z_{nn}$, and $Z_{mn} = Z_{nm}$ of the bus impedance submatrix Z(mnp) are obtained. The matrix elements may be obtained from the initial parameter set of $\{Z_{sM}, Z_{sN}, Z_{tr}^{MN}\}$, the line impedance $Z_l$ of the line MN, and the modification calculations of Equation (6).

At step 72, matrix elements $Z_{pp}$, $Z_{mp} = Z_{pm}$ and $Z_{np} = Z_{pn}$ of the bus impedance submatrix Z(mnp) are determined using measurements available at the substation bus level, for example based on Equation (15).

At step 73, the updated parameter set of $\{Z_{sM}, Z_{sN}, Z_{tr}^{MN}\}$ is determined. This may comprise determining the impedance submatrix Z(mnp)" from the impedance submatrix Z(mnp) by performing modification computations (Equations (6) and (7)), and determining the updated parameter set of $\{Z_{sM}, Z_{sN}, Z_{tr}^{MN}\}$ from the impedance submatrix Z(mnp)" in accordance with Equation (4).

The method may further comprise performing an analysis, protection, or coordination function based on the updated parameter set of $\{Z_{sM}, Z_{sN}, Z_{tr}^{MN}\}$.

Application to Test System

Figure 16:
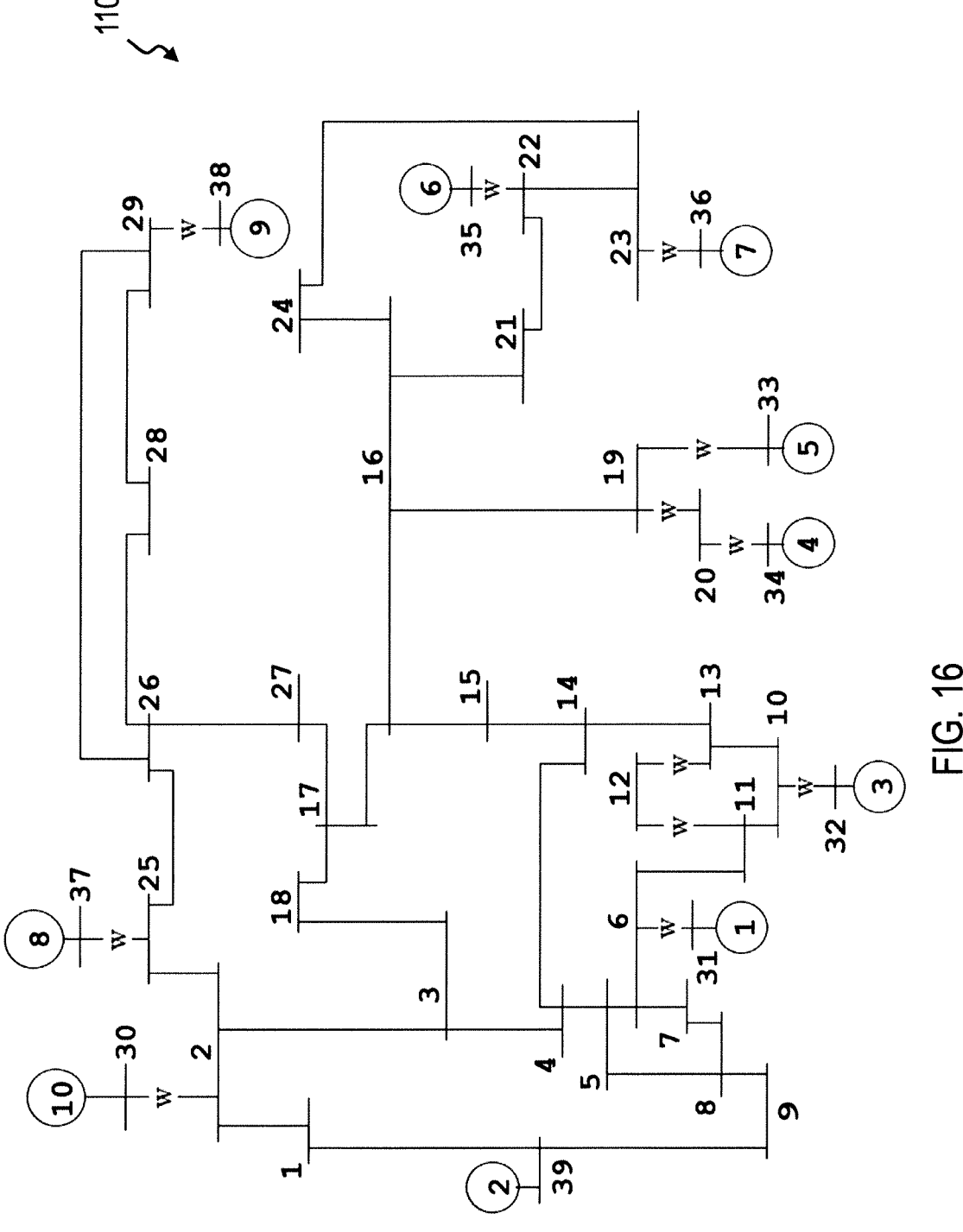
FIG. 16 is a single line diagram of a test system.

The test system considered is IEEE 39 bus NETS-NYPS system (Manitoba HVDC Research Centre, IEEE Test Systems, available at: http://forum.hvdc.ca/1598644/IEEE-Test-Systems). The single line diagram is shown in FIG. 16. The system consists of 10 sources, 39 buses, 34 transmission lines, 12 transformers and 19 loads. Transmission lines are represented by the Bergeron's model. For this illustration, we consider the following case: Line MN=17-16, Line MP=17-27. The method explained with reference to FIGS. 7 to 10 (including use of Equation (10)) is used to update the two-port equivalent for Line 17-16 in FIG. 16. The base equivalent impedance parameters are obtained by complete network analysis approach of the base network. The obtained results are compared with the equivalent obtained by complete network analysis of the modified network. A step-by-step analysis is shown below.

1. Obtain Z(mn) by using the impedance parameters of the two-port equivalent across lines MN in the base network and modification calculations pertaining to addition of line MN:

The base equivalent impedance parameters for line MN are $Z_{sM}$=0.0075+0.0288i, $Z_{sN}$=0.0054+0.0167i, $Z_{tr}{}^{MN}$=0.0186+0.2038i. Using the formula (5), one obtains $$Z(mn)' = \begin{pmatrix} Z'_{mm} & Z'_{mn} \\ Z'_{nm} & Z'_{nn} \end{pmatrix} = \begin{pmatrix} 0.0033+0.0135i & 0.0030+0.0089i \\ 0.0030+0.0089i & 0.0033+0.0116i \end{pmatrix}$$

Z(mn) is determined by carrying out the modification calculations on Z(mn)' pertaining to addition of the line MN with series impedance $Z_l$, between buses M and N as shown below:

$$Z(mn) = Z(mn)' - \frac{Z_{12}Z_{12}^T}{Z'_{mm}+Z'_{nn}-2Z'_{mn}+Z_l}$$

where $Z_{12}$ represents the vector difference between the two columns of Z(mn)'. The Z(mn) matrix thus obtained is shown below.

$$Z(mn) = \begin{pmatrix} 0.0033+0.0135i & 0.0030+0.0089i \\ 0.0030+0.0089i & 0.0033+0.0116i \end{pmatrix}$$

2. A similar determination is performed for line MP using its base equivalent impedance parameters and modification calculations pertaining to the addition of the line MP (considered as having both the series branch and shunt admittance branches) to obtain $$Z(mp) = \begin{pmatrix} 0.0033+0.0135i & 0.0033+0.0102i \\ 0.0033+0.0102i & 0.0049+0.0202i \end{pmatrix}$$

3. From measurements (simulated for the test), the change in voltage of bus N, current on the line MP at bus M end before trip of the line MP tripped and the ratio of the sum of charging current to load current is as follows:

$\Delta V_n$=−0.8276−0.7141i, $I_{mc}+I_{mp}$=−0.1648+0.1199i, $I_{mc}+I_{pc}$=0.3472+0.1865i 4. $Z_{pn}$ is obtained by using Equation (10) and Z(mnp) is constructed by collating Z(mn), Z(mp) and $Z_{pn}$.

$Z_{pn}$ = 0.0028 + 0.0067i $$Z(mnp) = \begin{pmatrix} 0.0033+0.0135i & 0.0030+0.0089i & 0.0033+0.0102i \\ 0.0030+0.0089i & 0.0033+0.0116i & 0.0028+0.0067i \\ 0.0033+0.0102i & 0.0028+0.0067i & 0.0049+0.0202i \end{pmatrix}$$

5. From the obtained Z(mnp), the effect of line MN is removed as shown below $$Z(mnp)' = Z(mnp) - \frac{Z_{12}Z_{12}^T}{Z_{mm}+Z_{nn}-2Z_{mn}-Z_l}$$

where $Z_{12}$ represents the vector difference between the first two columns of Z(mnp). From Z(mnp)' the effect of line MP (considered as having both the series branch and shunt admittance branches) is removed in a similar manner to obtain $$Z(mnp)'' = \begin{pmatrix} 0.0074+00375i & 0.0012+0.0025i & 0.0010+0.0051i \\ 0.0012+0.0025i & 0.0047+0.0158i & 0.0010+0.0004i \\ 0.0010+0.0051i & 0.0010+0.0004i & 0.0151+0.0433i \end{pmatrix}$$

6. Then using Equation (4), we obtain the updated equivalent impedances for line MN $Z_{sM}$=0.0100+0.0440i,$Z_{sN}$=0.0052+0.0167i,
$Z_{tr}{}^{MN}$=0.0126+0.2162i For comparison, equivalent impedances obtained for the modified network from network analysis (i.e., obtained based on a re-computation of the bus impedance matrix of the full network) provides:

$Z_{sM}{}^{act}$=0.0096+0.0447i,$Z_{sN}{}^{act}$=0.0053+0.0166i,
$Z_{tr}{}^{act}$=−0.0219+0.2221i The obtained results from step 6 when compared with the actual values as stated above, we obtain the following percentage errors in the estimation:

err_$Z_{sM}$=1.54%, err_$Z_{sN}$=0.77%, err_$Z_{tr}$=12.3%

Thus, good results are obtained even when using only local measurements, without relying on a re-computation of the bus impedance matrix of the full network.

Determining $Z_{np}$ and Updated Impedance Values for Shunt Element Trip

Figure 12:
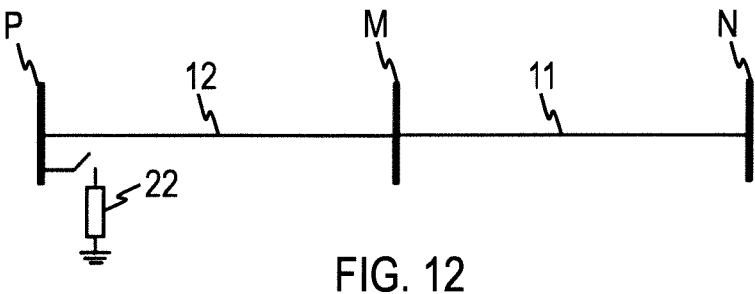
FIG. 12 is a single-line diagram after a shunt element trip.

This scenario corresponds to the situation in which the system is operating in (quasi-) steady state and a shunt element 22 (e.g., reactor/capacitor) trips at bus P leading the system into a new operating condition. At this new operating condition, the two port equivalent parameters for the line MN have changed, which are to be estimated. FIG. 12 depicts this state.

The determination of the matrix elements $Z_{np}$=$Z_{pn}$ may use one, several or all the following inputs:

(i) impedances $\{Z_{sM}, Z_{sN}, Z_{tr}{}^{MN}\}$ of the two-port equivalent across the first transmission line 11 before the trip event (i.e., the initial impedances prior to the trip); optionally, the impedances $\{Z_{sM}, Z_{sP}, Z_{tr}{}^{MP}\}$ of the two-port equivalent across the second transmission line 12 before the trip event (i.e., the initial impedances prior to the trip);
  (ii) voltage measurements at the second bus N, and optionally voltage measurements at the buses M and P;
  (iii) current measurement and impedance parameters of the shunt element 22 at the bus P (the current measurement being optional);
  (iv) parameters of the first line 11 between buses M and N and/or of the second line 12 between buses M and P (such as line impedances $Z_l$ and $Z_l^r$);
  (v) breaker status signals of the shunt element 22.

Figure 13:
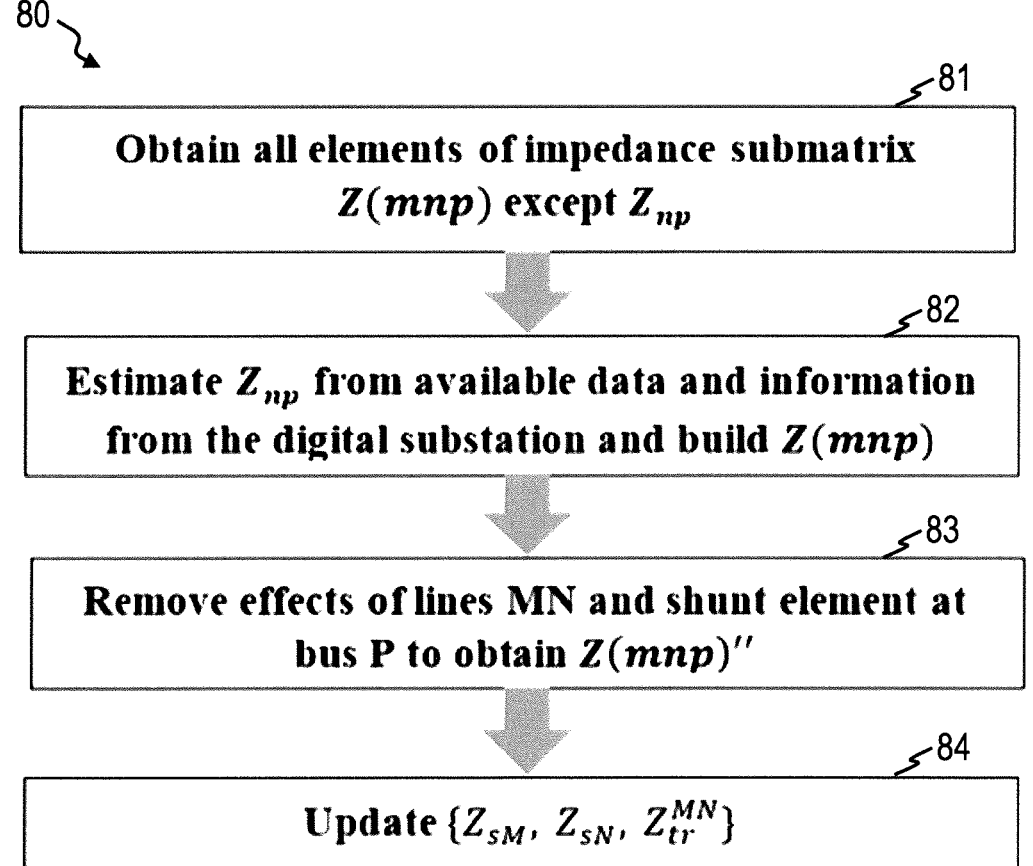
FIG. 13 is a flow chart of a method.

FIG. 13 is a flow chart of a method 80. The method may be performed automatically by the device 30.

At step 81, matrix elements of the bus impedance sub-matrix Z(mnp) are obtained. The matrix elements may be obtained from the initial parameter set of $\{Z_{sM}, Z_{sN}, Z_{tr}{}^{MN}\}$ and, optionally, $\{Z_{sM}, Z_{sP}, Z_{tr}{}^{MP}\}$, and parameters of the line(s) (such as shunt impedances).

At step 82, the matrix elements $Z_{np}$=$Z_{pn}$ may be determined using measurements available at the substation bus level. Implementations for determining these matrix elements are described in detail below.

At step 83, the impedance submatrix Z(mnp)″ is determined from the impedance submatrix Z(mnp) by performing modification computations (Equations (6) and (7)). The modification computations comprise removing the shunt element 22 at bus P and first line 11 between buses M and N.

At step 84, the updated parameter set of $\{Z_{sM}, Z_{sN}, Z_{tr}{}^{MN}\}$ is determined from the impedance submatrix Z(mnp)″ in accordance with Equation (4).

The method may further comprise performing an analysis, protection, or coordination function based on the updated parameter set of $\{Z_{sM}, Z_{sN}, Z_{tr}{}^{MN}\}$.

Following is a description of the proposed process performed by the device where the impedance submatrix Z(mnp)′ corresponds to the network from which the shunt element at bus P (of impedance $Z_{sh}$) is removed from the base network. The impedance submatrix Z(mnp)″ corresponds to the network from which the line MN is also removed. The current flow on the shunt element at bus P $(I_p{}^{sh})$ can be considered as a current injection at bus P of the system without the shunt element physically present in the network. Therefore, tripping of the shunt element 22 can be considered as a change in current injections at bus P for the system without the shunt element at bus P.

For the trip of the shunt element at bus P, the voltage change at bus N can be represented by the following Equation:

$$\Delta V_n = I_p^{sh} Z_{pn}' \Rightarrow Z_{pm}' = \frac{\Delta V_n}{I_p^{sh}} \tag{15}$$

Thus, $Z'_{pn}$ can be obtained from measurements of voltage drop at bus N due to the shunt element trip at bus P and the current carried by the shunt element before it tripped.

The current $I_p{}^{sh}$ may be directly measured.

The current $I_p{}^{sh}$ may be calculated as per the following Equation (E3), thus making the technique free of using any current measurement for determining the updated impedances:

$$I_p^{sh} = \frac{V_p^0}{Z_{sh}} \tag{E3}$$

The elements of the impedance submatrix Z(mnp)′ are related to the elements of Z(mnp) by means of shunt branch modifications pertaining to the shunt element at bus P. Specifically, the following relationship applies:

$$Z_{pn}' = Z_{pn}\left(\frac{-Z_{sh}}{Z_{pp} - Z_{sh}}\right) \tag{16}$$

which is obtained by modification calculations pertaining to the removal of the shunt branch at bus P. Solving (15) and (16), $Z_{pn}$ can be determined as shown in Equation (17) below.

$$Z_{pn} = \left(\frac{Z_{pp} - Z_{sh}}{-Z_{sh}}\right) \frac{\Delta V_n}{I_p^{sh}} \tag{17}$$

Determining Updated Impedance Values for Shunt Element Trip (First Technique)

Thus, the device or method according to an embodiment can determine the updated impedance values for an incident line trip as follows:

obtaining Z(mn) by using the impedance parameters of the two-port equivalent across lines MN in the base network and modification calculations pertaining to addition of line MN;

obtaining Z(mp) by using the impedance parameters of the two-port equivalent across lines MP in the base network and modification calculations pertaining to addition of line MP obtaining the change in voltage of bus N due to the shunt element trip at bus P from measurements, and obtaining the current through the shunt element before it tripped (either by a current measurement or by deriving it computationally from a voltage measurement using, e.g., Equation (E3));

solving (17) to obtain $Z_{pn}$ and constructing the matrix Z(mnp);

sequentially remove the effects of shunt element at P and line MN from Z(mnp) using the necessary series and shunt modification calculations to obtain Z(mnp)″;

determining the updated equivalent impedances $\{Z_{sM}, Z_{sN}, Z_{tr}{}^{MN}\}$ of the two-port equivalent across the first transmission line 11 from Z(mnp)″ (Equation (4)).

Figure 14:
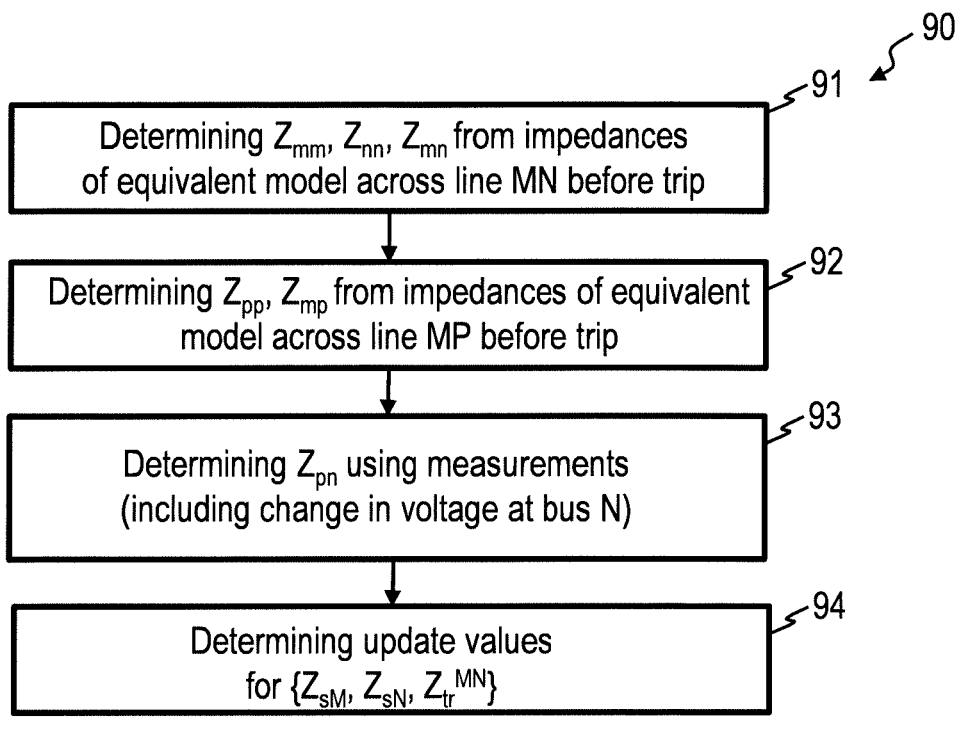
FIG. 14 is a flow chart of a method.

FIG. 14 is a flow chart of a method 90. The method may be performed automatically by the device 30.

At step 91, matrix elements $Z_{mm}$, $Z_{nn}$, and $Z_{mn}=Z_{nm}$ of the bus impedance submatrix Z(mnp) are obtained. The matrix elements may be obtained from the initial parameter set of $\{Z_{sM}, Z_{sN}, Z_{tr}{}^{MN}\}$, using the modification calculations of Equations (6) and (7).

At step 92, matrix elements $Z_{pp}$ and $Z_{mp}=Z_{pm}$ of the bus impedance submatrix Z(mnp) are obtained. The matrix elements may be obtained from the initial parameter set of $\{Z_{sM}, Z_{sP}, Z_{tr}{}^{MP}\}$, using the modification calculations of Equations (6) and (7).

At step 93, the matrix elements $Z_{np}=Z_{pn}$ may be determined using measurements available at the substation bus level, for example based on Equation (17).

At step 94, the updated parameter set of $\{Z_{sM}, Z_{sN}, Z_{tr}{}^{MN}\}$ is determined. This may comprise determining the impedance submatrix Z(mnp)″ from the impedance submatrix Z(mnp) by performing modification computations (Equations (6) and (7)), and determining the updated parameter set of $\{Z_{sM}, Z_{sN}, Z_{tr}{}^{MN}\}$ from the impedance submatrix Z(mnp)″ in accordance with Equation (4).

The method may further comprise performing an analysis, protection, or coordination function based on the updated parameter set of $\{Z_{sM}, Z_{sN}, Z_{tr}{}^{MN}\}$.

Determining Updated Impedance Values for Shunt Element Trip (Second Technique)

Alternatively, the device and method may determine the updated impedances of the two-port equivalent without requiring information on the impedances of the two-port equivalent across line MP before the trip event. In this case, in addition to $Z_{pn}$, $Z_{mp}$ and $Z_{pp}$ can also be determined from measurements. For example, the following relationships can be used:

$$Z_{pp}' = \frac{\Delta V_p}{I_p^{sh}}, Z_{pp}' = Z_{pp}\left(\frac{-Z_{sh}}{Z_{pp} - Z_{sh}}\right) \tag{18}$$

-continued $$Z'_{pm} = \frac{\Delta V_m}{I_p^{sh}}, \; Z'_{mp} = Z_{mp}\left(\frac{-Z_{sh}}{Z_{pp} - Z_{sh}}\right) \quad (19)$$

The device and method may use Equation (18) to determine $Z_{pp}$. The obtained value of $Z_{pp}$ can be used to solve Equations (17) and (18) for $Z_{mp}$ and $Z_{np}$ respectively. Thus, the updated source impedances can be obtained with fewer base information, specifically without requiring the impedances of the two-port equivalent across line MP before the trip event. However, the device and method require measurements from buses P and M in response to the shunt element trip.

Thus, the device or method according to an embodiment can determine the updated impedance values for an incident line trip as follows:

> obtaining Z(mn)' by using the impedance parameters of the two-port equivalent across lines MN in the base network.
> obtaining all elements of Z(mn) except $Z_{mp}$, $Z_{np}$ and $Z_{pp}$ by using modification calculations pertaining to addition of line MN.
> obtaining the change in voltage of buses M, N and P due to the shunt element trip at bus P. Also obtain the current through the shunt element before it tripped (either by a current measurement or by deriving it computationally from a voltage measurement using, e.g., Equation (E3)).
> solving Equations (17)-(19) to obtain $Z_{mp}$, $Z_{np}$ and $Z_{pp}$, and constructing the matrix Z(mnp);
> sequentially remove the effects of line MN and MP from Z(mnp) using the necessary series and shunt modification calculations to obtain Z(mnp)";
> using Equation (4) to obtain the updated equivalent impedances.

Figure 15:
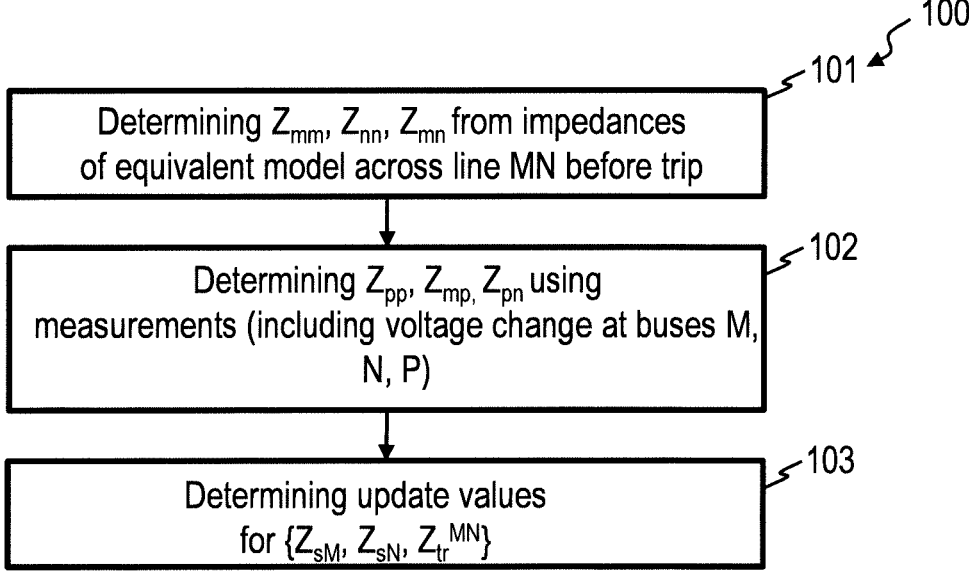
FIG. 15 is a flow chart of a method.

FIG. 15 is a flow chart of a method 100. The method may be performed automatically by the device 30.

At step 101, matrix elements $Z_{mm}$, $Z_{nn}$, and $Z_{mn}=Z_{nm}$ of the bus impedance submatrix Z(mnp) are obtained. The matrix elements may be obtained from the initial parameter set of $\{Z_{sM}, Z_{sN}, Z_{tr}^{MN}\}$ and the modification calculations of Equations (6), (7).

At step 102, matrix elements $Z_{pp}$, $Z_{mp}=Z_{pm}$ and $Z_{np}=Z_{pn}$ of the bus impedance submatrix Z(mnp) are determined using measurements available at the substation bus level, for example based on Equations (17)-(19).

At step 103, the updated parameter set of $\{Z_{sM}, Z_{sN}, Z_{tr}^{MN}\}$ is determined. This may comprise determining the impedance submatrix Z(mnp)" from the impedance submatrix Z(mnp) by performing modification computations (Equations (6) and (7)), and determining the updated parameter set of $\{Z_{sM}, Z_{sN}, Z_{tr}^{MN}\}$ from the impedance submatrix Z(mnp)" in accordance with Equation (4).

The method may further comprise performing an analysis, protection, or coordination function based on the updated parameter set of $\{Z_{sM}, Z_{sN}, Z_{tr}^{MN}\}$.

Application to Test System

The test system considered is IEEE 39 bus NETS-NYPS system (FIG. 16). The following case: Line MN=5-8, Line MP=5-6, shunt reactor of rating 200 MVar connected at bus 6 trips. The technique explained above is applied to update the two-port equivalent for Line 5-8. The base equivalent impedance parameters are obtained by complete network analysis approach of the base network (shunt reactor at bus 6 considered to be present). The obtained results are compared with the equivalent obtained by complete network analysis of the modified network.

1. Obtain Z(mn) by using the impedance parameters of the two-port equivalent across lines MN in the base network and modification calculations pertaining to addition of line MN The base equivalent impedance parameters for line MN are $Z_{sM}$=0.0038+0.0221i, $Z_{sN}$=0.0171+0.0410i, $Z_{tr}^{MN}$=0.0011+0.0173i. Using the formula (5), one obtains $$Z(mn)' = \begin{pmatrix} Z'_{mm} & Z'_{mn} \\ Z'_{nm} & Z'_{nn} \end{pmatrix} = \begin{pmatrix} 0.0034 + 0.0161i & 0.0035 + 0.01114i \\ 0.0035 + 0.0114i & 0.0053 + 0.0205i \end{pmatrix}$$

Z(mn) is determined by carrying out the modification calculations on Z(mn)' pertaining to addition of the line MN:

$$Z(mn) = \begin{pmatrix} 0.0035 + 0.0152i & 0.0036 + 0.0131i \\ 0.0036 + 0.0131i & 0.0043 + 0.0172i \end{pmatrix}$$

2. A similar processing is performed for line MP using its base equivalent impedance parameters and modification calculations pertaining to the addition of the line MP (considered as having both the series branch and shunt admittance branches) to obtain $$Z(mp) = \begin{pmatrix} 0.0035 + 0.0152i & 0.0034 + 0.0140i \\ 0.0034 + 0.0140i & 0.0034 + 0.0151i \end{pmatrix}$$

3. From measurements (simulated for the test), the change in voltage of bus N, and current through the shunt element before it tripped are obtained:

$$\Delta V_n = -1.2838 - 3.2123i, I_p^{sh} = -0.4919 + 0.0654i$$

4. $Z_{pn}$ is obtained by solving (16), (17) and Z(mnp) is constructed by collating Z(mn), Z(mp) and $Z_{pn}$.

$$Z_{pn} = 0.0034 + 0.0131i$$

$$Z(mnp) = \begin{pmatrix} 0.0035 + 0.0152i & 0.0036 + 0.0131i & 0.0034 + 0.0140i \\ 0.0036 + 0.0131i & 0.0043 + 0.0172i & 0.0034 + 0.0131i \\ 0.0034 + 0.0140i & 0.0034 + 0.0131i & 0.0034 + 0.0151i \end{pmatrix}$$

5. From the obtained Z(mnp), the effects of lines MN and MP are removed to obtain $$Z(mnp)'' = \begin{pmatrix} 0.0032 + 0.0157i & 0.0033 + 0.0111i & 0.0031 + 0.0140i \\ 0.0033 + 0.0111i & 0.0051 + 0.0202i & 0.0032 + 0.0120i \\ 0.0031 + 0.0140i & 0.0032 + 0.0121i & 0.0032 + 0.0148i \end{pmatrix}$$

6. Using Equation (4), the updated equivalent impedances for line MN are obtained as follows:

$$Z_{sM}=0.0036+0.0214i \; Z_{sN}=0.0167+0.0405i$$
$$Z_{tr}=0.0011+0.0174i$$

Equivalent impedances obtained for the modified network from network analysis:

$$Z_{sM}{}^{act}=0.0036+0.0213i \quad Z_{sN}{}^{act}=0.0170+0.0402i$$
$$Z_{tr}{}^{act}=0.0011+0.0174i$$

The obtained results from step 6 when compared with the actual values as stated above, we obtain the following percentage errors in the estimation:

$$\text{err}\_Z_{sM}=0.4\%, \text{err}\_Z_{sN}=1.0\%, \text{err}\_Z_{tr}=0.05\%$$

Thus, good results are obtained even when using only local measurements, without relying on a re-computation of the bus impedance matrix of the full network.

The updated equivalent model can be used for various analyses, protection and/or coordination functions. For example, it can be used for setting the operational characteristics of a distance relay protecting the transmission line of interest and for determining the source to line impedance ratio (SIR) for the relay, using, for example, the techniques described in "IEEE Guide for Protective Relay Applications to Transmission Lines," in IEEE Std C37.113-2015 (Revision of IEEE Std C37.113-1999), pp. 1-141, 30 Jun. 2016. The updated model can also be used for setting the power swing blinders and out of step logic, using, for example, the techniques described in "POWER SWING AND OUT-OF-STEP CONSIDERATIONS ON TRANSMISSION LINES", IEEE PSRC WG D6, 2005, pp. 45-48. Also, the updated model can help analyses such as locating a fault on the line when using only single ended measurements, using, for example, the techniques described in L. Eriksson, M. M. Saha and G. D. Rockefeller, "An Accurate Fault Locator with Compensation for Apparent Reactance in The Fault Resistance Resulting from Remote-End Infeed," in IEEE Transactions on Power Apparatus and Systems, vol. PAS-104, No. 2, pp. 423-436, February 1985.

The parameters of the two-port equivalent depend on the network topology. The devices, systems, and methods according to embodiments allow the parameters of the two-port equivalent to be updated online as the network topology changes, without requiring the bus impedance matrix of the full network to be re-calculated.

Figure 17:
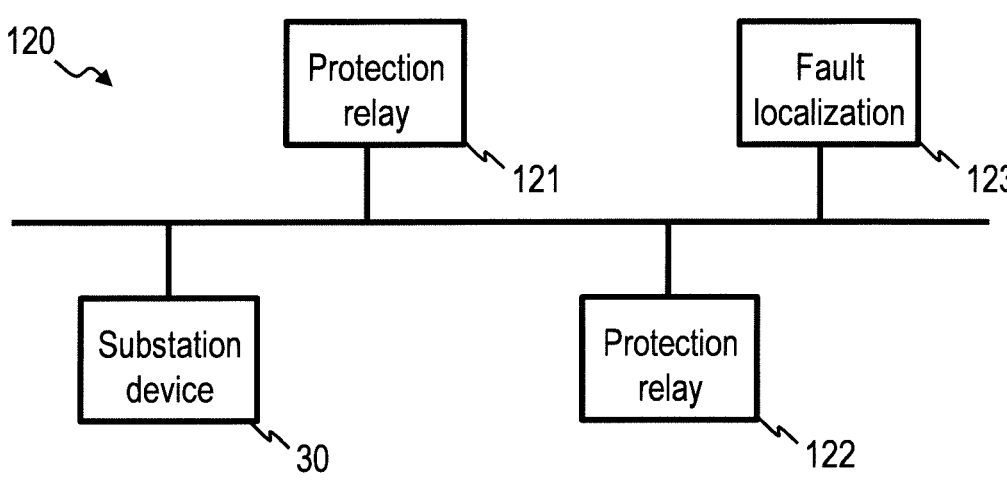
FIG. 17 is a schematic partial representation of substation devices.

The techniques disclosed herein may be performed by a substation device 30 that is a protection device. Alternatively or additionally, the device 30 that determines the updated impedances of the two-port equivalent across a transmission line may be communicatively coupled to protection relays 121, 122, fault localization devices 123, and/or other elements of a substation system 120, as illustrated in FIG. 17. The substation device 30 may be communicatively coupled to the protection relays 121, 122, fault localization devices 123, and/or other elements of a substation system 120 via a substation communication bus.

Figure 18:
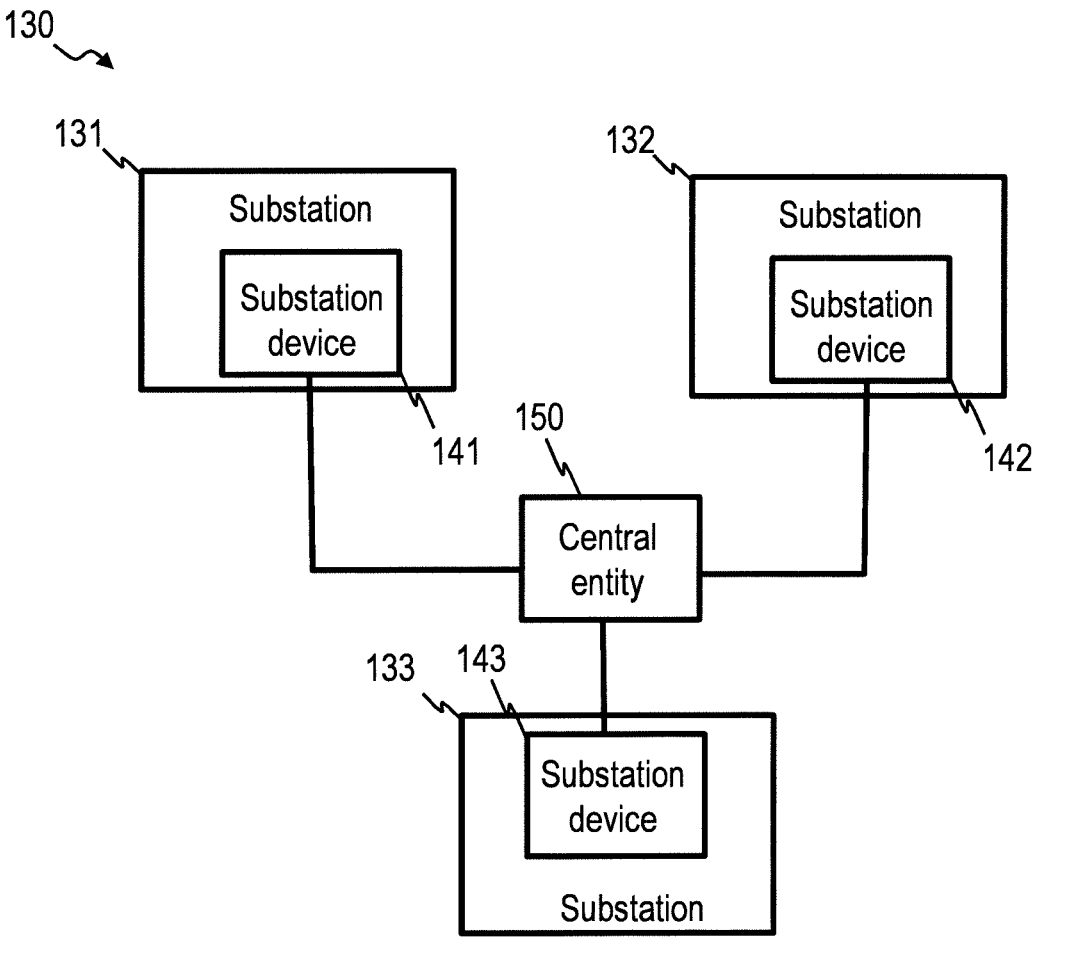
FIG. 18 is a schematic partial representation of an electric power system.

FIG. 18 is a schematic diagram of an electric power system 130. The electric power system 130 has a plurality of substations 131-133, each comprising a substation device or system 141-143 operative to determine updated impedances of a two-port equivalent model using the techniques disclosed herein.

The electric power system 130 may comprise a central entity 150 communicatively coupled to the substation devices or systems 141-143. The central entity 150 may be operative to coordinate the substation devices or systems 141-143. Alternatively or additionally, the central entity 150 may be operative to combine updated impedances obtained from different substation devices or system 141-143.

The substation devices or systems 141-143 may be operative to update equivalent impedances independently of each other. For illustration, a first substation device or system 141 may be operative to update impedances using measurements of the associated first substation 131 and, optionally, an adjacent bus and incident line responsive to a first trip event. A time at which the first substation device or system 141 determines the updated impedances may be independent of a time at which any of the other substation devices or system 142, 143 (e.g., a second substation device or system 142 of a second substation 132 and/or a third substation device or system 143 of a third substation 133) determines updated impedances. The impedances of the first, second and, if present, additional substation devices or systems 141-143 as updated during field operation may be updated at times and/or to values that are independent of each other.

The central entity 150 may be operative to receive updated impedances from the substation devices or systems 141-143.

The central entity 150 may be operative to combine updated impedances from the substation devices or systems. The central entity 150 may be operative to update a bus matrix, using the updated impedances from the substation devices or systems 141-143.

The central entity 150 may be operative to coordinate operation of the substation devices or systems 141-143 of different substations.

The central entity 150 and/or the substation devices or systems 141-143 may be operative to use the updated impedances for analyses, protection and/or coordination functions. The central entity 150 and/or the substation devices or systems 141-143 may be operative to use the updated impedances for one or several of: setting operational characteristics of a distance relay, setting power swing blinders and/or out of step logic, locating a fault on the line (e.g., when using only single ended measurements, or for other techniques of performing fault localization).

Embodiments provide a device, system and method for updating the two-port Thevenin equivalent across a transmission line. The devices and method may be operative for collating data and measurements from the line terminals and substations one level up in the topology in order to update the equivalent model when a topological change happens in the vicinity of the line of interest. The scenarios considered are tripping of an incident line and tripping of a shunt element at an adjacent bus. Various solutions are provided which correspond to these scenarios. The device, system and method can be implemented in a digital substation for supporting adaptive protection features, without being limited thereto.

The devices, methods, and systems according to embodiments may be used to provide improved distance protection for transmission networks in which the lines may have a length of at least 50 km, of at least 100 km, of at least 150 km, of at least 200 km, without being limited thereto. For illustration, the devices, methods, and systems according to embodiments may be used for performing a wide variety of different protection, monitoring, and/or analysis functions for an electric power system.

In the methods, devices, and systems, a protection function and/or the generation of an output may be automatically triggered, using the updated impedances.

The devices, methods, and systems according to embodiments may be used to provide distance protection for transmission networks in an electric grid that includes renewable energy sources.

While the subject matter has been described in detail in the drawings and foregoing description, such description is to be considered illustrative or exemplary and not restrictive. Variations to the disclosed embodiments can be understood and effected by those skilled in the art and practicing the claimed embodiments, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A method of determining updated impedances of an equivalent model across a transmission line for an electric power system, the electric power system comprising a first bus, a second bus, a third bus, a first line between the first and second buses, and a second line between the third bus and one of the first and second buses, the method comprising:

receiving, by a substation system, measurements comprising voltage measurements for one or several of the buses and switch status information;

determining, by the substation system, responsive to at least one trip event, one or several updated impedances of the equivalent model from the received measurements and impedances of the equivalent model obtained before the at least one trip event, wherein the substation system determines the one or several updated impedances of the equivalent model responsive to a trip of a shunt element at the third bus using the following quantities obtained from measurements:

a shunt current through the shunt element at the third bus prior to the trip of the shunt element, the shunt current being obtained from a shunt current measurement prior to the trip or being determined computationally, and a change in voltage at the second bus in response to the trip of the shunt element, wherein the substation system determines the one or several updated impedances of the equivalent model responsive to a trip of a shunt element at the third bus using measurements of changes in voltages at the first and third buses in response to the trip of the shunt element; and performing a protection function using the updated impedances of the equivalent model, wherein the protection function comprises at least one of setting operational characteristics of a distance relay, locating a fault on the transmission line, or setting power swing blinders.

2. The method of claim 1, wherein determining the one or several updated impedances of the equivalent model only utilizes substation process bus level measurements, and the impedances of the equivalent model before the at least one trip event.

3. The method of claim 2, wherein all measurements used for determining the one or several updated impedances of the equivalent model are obtained in a neighborhood of the first line.

4. The method of claim 1, wherein the updated impedances of the equivalent model comprise an updated first equivalent source impedance, an updated second equivalent source impedance, and an updated equivalent transfer path impedance.

5. The method of claim 3, wherein the substation system is operative to determine the one or several updated impedances without a re-computation of a full bus impedance matrix of the electric power system.

6. The method of claim 1, wherein the measurements are obtained at a substation level in the substation system.

7. The method of claim 1, wherein the one or several updated impedances of the equivalent model are updated impedances of the equivalent model of a two-port equivalent across the first line subsequent to the at least one trip event, and wherein the impedances of the equivalent model before the trip event comprise impedances of the equivalent model of the two-port equivalent prior to the at least one trip event.

8. The method of claim 1, wherein determining the one or several updated impedances of the equivalent model comprises:

determining at least one matrix element of a bus impedance submatrix using the measurements;

performing series and/or shunt branch modifications of the bus impedance submatrix to determine matrix elements of a modified bus impedance submatrix; and determining the updated impedances of the equivalent model of the two-port equivalent using the modified bus impedance submatrix.

9. The method of claim 8, wherein the bus impedance submatrix is $$Z(mnp) = \begin{pmatrix} Z_{mm} & Z_{mn} & Z_{mp} \\ Z_{nm} & Z_{nn} & Z_{np} \\ Z_{pm} & Z_{pn} & Z_{pp} \end{pmatrix},$$

wherein the substation system determines $Z_{np} = Z_{pn}$ using the measurements, wherein the substation system determines at least $Z_{mm}$, $Z_{mn}$, $Z_{nm}$, and $Z_{nn}$ from impedances of the equivalent model of the two-port equivalent before the at least one trip event and modification calculations, wherein $Z_{ij}$ designates the impedance of the equivalent model between two nodes i and j selected from {m, n, p}, wherein m designates the first bus, n designates the second bus, and p designates the third bus.

10. The method of claim 9, wherein the substation system determines the modified bus impedance submatrix $$Z(mnp)'' = \begin{pmatrix} Z''_{mm} & Z''_{mn} & Z''_{mp} \\ Z''_{nm} & Z''_{nn} & Z''_{np} \\ Z''_{pm} & Z''_{pn} & Z''_{pp} \end{pmatrix}$$

from the bus impedance submatrix Z(mnp) by performing series branch modifications comprising removing the branches between nodes m and p and between nodes m and n, wherein the substation system determines the updated impedances of the equivalent model of the two-port equivalent such that they fulfill $$Z_{sM} = \frac{Z''_{mm} Z''_{nn} - Z''_{mn} Z''_{nm}}{Z''_{nn} - Z''_{mn}},$$

$$Z_{sN} = \frac{Z''_{mm} Z''_{nn} - Z''_{mn} Z''_{nm}}{Z''_{mm} - Z''_{mn}},$$

$$Z_{tr}^{MN} = \frac{Z''_{mm} Z''_{nn} - Z''_{mn} Z''_{nm}}{Z''_{mn}}.$$

wherein $Z_{sM}$ is an impedance of a first source of the two-port equivalent, $Z_{sN}$ is an impedance of a second source of the two-port equivalent, and $Z_{tr}^{MN}$ is an impedance of a transfer path between the first source and the second source.

11. The method of claim 1, wherein the substation system determines the one or several updated impedances of the equivalent model responsive to a trip of the second line.

12. The method of claim 11, wherein the substation system determines the one or several updated impedances of the equivalent model responsive to a trip of the second line using measurements of:

a change in voltage at the second bus in response to the trip of the second line; and a current on the second line at the first bus before the trip of the second line.

13. The method of claim 12, wherein the substation system determines the one or several updated impedances of the equivalent model responsive to a trip of the second line using the following quantities obtained from measurements:

(i) changes in voltages at the first and third buses in response to the trip of the second line; or (ii) a current of the second line at first bus before the trip of the second line.

14. A substation system for use with an electric power system, the electric power system comprising a first bus, a second bus, a third bus, a first line between the first and second buses, and a second line between the third bus and one of the first and second buses, wherein the substation system comprises an interface to receive measurements comprising voltage measurements for one or several of the buses and switch status information;

wherein the substation is operative to determine, responsive to at least one trip event, one or several updated impedances of an equivalent model from the received measurements and impedances of the equivalent model obtained before the at least one trip event, and trigger a protection function using the updated impedances of the equivalent model;

wherein the substation system determines the one or several updated impedances of the equivalent model responsive to a trip of a shunt element at the third bus using the following quantities obtained from measurements:

a shunt current through the shunt element at the third bus prior to the trip of the shunt element, the shunt current being obtained from a shunt current measurement prior to the trip or being determined computationally, and a change in voltage at the second bus in response to the trip of the shunt element, wherein the substation system determines the one or several updated impedances of the equivalent model responsive to a trip of a shunt element at the third bus using measurements of changes in voltages at the first and third buses in response to the trip of the shunt element; and wherein the protection function comprises at least one of setting operational characteristics of a distance relay, locating a fault on the transmission line, or setting power swing blinders.

15. An electric power system, comprising:

a first bus;

a second bus;

a third bus;

a first line between the first and second buses; and a second line between the third bus and one of the first and second buses; and the substation system of claim 14 to determine updated impedances of the equivalent model of a two-port equivalent from the received measurements and base impedances of the equivalent model.

16. An electric power system, comprising:

a plurality of substations, each comprising a substation system according to claim 14; and a central entity communicatively coupled to the substation systems and operative to coordinate the substation systems and/or to combine updated impedances obtained from different substation systems.

* * * * *